United States Patent
Chung et al.

(10) Patent No.: US 6,936,906 B2
(45) Date of Patent: Aug. 30, 2005

(54) INTEGRATION OF BARRIER LAYER AND SEED LAYER

(75) Inventors: Hua Chung, San Jose, CA (US); Ling Chen, Sunnyvale, CA (US); Jick Yu, San Jose, CA (US); Mei Chang, Saratoga, CA (US)

(73) Assignee: Applied Materials, Inc., Santa Clara, CA (US)

( * ) Notice: Subject to any disclaimer, the term of this patent is extended or adjusted under 35 U.S.C. 154(b) by 66 days.

(21) Appl. No.: 09/965,373

(22) Filed: Sep. 26, 2001

(65) Prior Publication Data

US 2003/0057527 A1 Mar. 27, 2003

(51) Int. Cl.[7] .............................................. H01L 27/095
(52) U.S. Cl. ........................ 257/486; 257/485; 257/740; 257/751; 257/761; 257/767; 438/256; 438/399; 438/674; 438/903
(58) Field of Search ................................ 438/256, 384, 438/399, 674, 675, 903

(56) References Cited

U.S. PATENT DOCUMENTS

| | | | |
|---|---|---|---|
| 4,058,430 A | 11/1977 | Suntola et al. | 156/611 |
| 4,389,973 A | 6/1983 | Suntola et al. | 118/725 |
| 4,413,022 A | 11/1983 | Suntola et al. | 427/255.2 |
| 4,486,487 A | 12/1984 | Skarp | 428/216 |
| 4,767,494 A | 8/1988 | Kobayashi et al. | 156/606 |
| 4,806,321 A | 2/1989 | Nishizawa et al. | 422/245 |
| 4,813,846 A | 3/1989 | Helms | 414/744.1 |
| 4,829,022 A | 5/1989 | Kobayashi et al. | 437/107 |
| 4,834,831 A | 5/1989 | Nishizawa et al. | 156/611 |
| 4,838,983 A | 6/1989 | Schumaker et al. | 156/613 |
| 4,838,993 A | 6/1989 | Aoki et al. | 156/643 |
| 4,840,921 A | 6/1989 | Matsumoto | 437/89 |
| 4,845,049 A | 7/1989 | Sunakawa | 437/81 |
| 4,859,625 A | 8/1989 | Nishizawa et al. | 437/81 |
| 4,859,627 A | 8/1989 | Sunakawa | 437/81 |
| 4,861,417 A | 8/1989 | Mochizuki et al. | 156/610 |
| 4,876,218 A | 10/1989 | Pessa et al. | 437/107 |

(Continued)

FOREIGN PATENT DOCUMENTS

| | | | | |
|---|---|---|---|---|
| DE | 196 27 017 | 1/1997 | ......... | H01L/21/283 |
| DE | 198 20 147 | 7/1999 | ....... | H01L/21/3205 |

(Continued)

OTHER PUBLICATIONS

PCT International Search Report from International Application Number PCT/US02/28715, dated May 30, 2003.

(Continued)

*Primary Examiner*—Long Pham
*Assistant Examiner*—Wai-Sing Louie
(74) *Attorney, Agent, or Firm*—Moser, Patterson & Sheridan LLP (57) ABSTRACT

The present invention generally relates to filling of a feature by depositing a barrier layer, depositing a seed layer over the barrier layer, and depositing a conductive layer over the seed layer. In one embodiment, the seed layer comprises a copper alloy seed layer deposited over the barrier layer. For example, the copper alloy seed layer may comprise copper and a metal, such as aluminum, magnesium, titanium, zirconium, tin, and combinations thereof. In another embodiment, the seed layer comprises a copper alloy seed layer deposited over the barrier layer and a second seed layer deposited over the copper alloy seed layer. The copper alloy seed layer may comprise copper and a metal, such as aluminum, magnesium, titanium, zirconium, tin, and combinations thereof. The second seed layer may comprise a metal, such as undoped copper. In still another embodiment, the seed layer comprises a first seed layer and a second seed layer. The first seed layer may comprise a metal, such as aluminum, magnesium, titanium, zirconium, tin, and combinations thereof. The second seed layer may comprise a metal, such as undoped copper.

31 Claims, 6 Drawing Sheets

U.S. PATENT DOCUMENTS

| | | | |
|---|---|---|---|
| 4,917,556 A | 4/1990 | Stark et al. ................. | 414/217 |
| 4,927,670 A | 5/1990 | Erbil ........................ | 427/255.3 |
| 4,931,132 A | 6/1990 | Aspnes et al. ............... | 156/601 |
| 4,951,601 A | 8/1990 | Maydan et al. .............. | 118/719 |
| 4,960,720 A | 10/1990 | Shimbo ...................... | 437/105 |
| 4,975,252 A | 12/1990 | Nishizawa et al. .......... | 422/245 |
| 4,993,357 A | 2/1991 | Scholz ....................... | 118/715 |
| 5,000,113 A | 3/1991 | Wang et al. ................ | 118/723 |
| 5,013,683 A | 5/1991 | Petroff et al. .............. | 437/110 |
| 5,028,565 A | 7/1991 | Chang et al. ............... | 437/192 |
| 5,082,798 A | 1/1992 | Arimoto ..................... | 437/108 |
| 5,085,885 A | 2/1992 | Foley et al. ................. | 477/38 |
| 5,091,320 A | 2/1992 | Aspnes et al. ................ | 437/8 |
| 5,130,269 A | 7/1992 | Kitahara et al. ............. | 437/111 |
| 5,166,092 A | 11/1992 | Mochizuki et al. .......... | 437/105 |
| 5,173,474 A | 12/1992 | Connell et al. ................ | 505/1 |
| 5,186,718 A | 2/1993 | Tepman et al. ............. | 29/25.01 |
| 5,205,077 A | 4/1993 | Wittstock ................. | 51/165 R |
| 5,225,366 A | 7/1993 | Yoder ........................ | 437/108 |
| 5,234,561 A | 8/1993 | Randhawa et al. .... | 204/192.38 |
| 5,246,536 A | 9/1993 | Nishizawa et al. .......... | 156/610 |
| 5,250,148 A | 10/1993 | Nishizawa et al. .......... | 156/611 |
| 5,254,207 A | 10/1993 | Nishizawa et al. .......... | 156/601 |
| 5,256,244 A | 10/1993 | Ackerman .................. | 156/613 |
| 5,259,881 A | 11/1993 | Edwards et al. ............ | 118/719 |
| 5,270,247 A | 12/1993 | Sakuma et al. ............. | 437/133 |
| 5,278,435 A | 1/1994 | Van Hove et al. .......... | 257/184 |
| 5,281,274 A | 1/1994 | Yoder ........................ | 118/697 |
| 5,286,296 A | 2/1994 | Sato et al. .................. | 118/719 |
| 5,290,748 A | 3/1994 | Knuuttila et al. ........... | 502/228 |
| 5,294,286 A | 3/1994 | Nishizawa et al. .......... | 156/610 |
| 5,296,403 A | 3/1994 | Nishizawa et al. .......... | 437/133 |
| 5,300,186 A | 4/1994 | Kitahara et al. ............. | 156/613 |
| 5,311,055 A | 5/1994 | Goodman et al. .......... | 257/593 |
| 5,316,615 A | 5/1994 | Copel et al. .................. | 117/95 |
| 5,316,793 A | 5/1994 | Wallace et al. .......... | 427/248.1 |
| 5,330,610 A | 7/1994 | Eres et al. .................... | 117/86 |
| 5,336,324 A | 8/1994 | Stall et al. .................. | 118/719 |
| 5,338,389 A | 8/1994 | Nishizawa et al. .......... | 117/89 |
| 5,348,911 A | 9/1994 | Jurgensen et al. ............ | 117/91 |
| 5,374,570 A | 12/1994 | Nasu et al. ................... | 437/40 |
| 5,395,791 A | 3/1995 | Cheng et al. ............... | 437/105 |
| 5,438,952 A | 8/1995 | Otsuka ........................ | 117/84 |
| 5,439,876 A | 8/1995 | Graf et al. .................. | 505/447 |
| 5,441,703 A | 8/1995 | Jurgensen ................... | 422/129 |
| 5,443,033 A | 8/1995 | Nishizawa et al. ........... | 117/86 |
| 5,443,647 A | 8/1995 | Aucoin et al. ....... | 118/723 ME |
| 5,455,072 A | 10/1995 | Bension et al. .......... | 427/255.7 |
| 5,458,084 A | 10/1995 | Thorne et al. ................. | 117/89 |
| 5,469,806 A | 11/1995 | Mochizuki et al. ........... | 117/97 |
| 5,480,818 A | 1/1996 | Matsumoto et al. .......... | 437/40 |
| 5,483,919 A | 1/1996 | Yokoyama et al. ............ | 117/89 |
| 5,484,664 A | 1/1996 | Kitahara et al. ............. | 428/641 |
| 5,503,875 A | 4/1996 | Imai et al. ................. | 427/255.3 |
| 5,521,126 A | 5/1996 | Okamura et al. ........... | 437/235 |
| 5,527,733 A | 6/1996 | Nishizawa et al. .......... | 437/160 |
| 5,532,511 A | 7/1996 | Nishizawa et al. .......... | 257/627 |
| 5,540,783 A | 7/1996 | Eres et al. ................... | 118/725 |
| 5,580,380 A | 12/1996 | Liu et al. ...................... | 117/86 |
| 5,601,651 A | 2/1997 | Watabe ....................... | 118/715 |
| 5,609,689 A | 3/1997 | Kato et al. .................. | 118/719 |
| 5,616,181 A | 4/1997 | Yamamoto et al. ... | 118/723 ER |
| 5,637,530 A | 6/1997 | Gaines et al. ............... | 114/105 |
| 5,641,984 A | 6/1997 | Aftergut et al. ............. | 257/433 |
| 5,644,128 A | 7/1997 | Wollnik et al. ............. | 250/251 |
| 5,654,232 A | 8/1997 | Gardner ...................... | 438/661 |
| 5,667,592 A | 9/1997 | Boitnott et al. ............. | 118/719 |
| 5,674,786 A | 10/1997 | Turner et al. ............... | 437/225 |
| 5,693,139 A | 12/1997 | Nishizawa et al. ........... | 117/89 |
| 5,695,564 A | 12/1997 | Imahashi ................... | 118/719 |
| 5,705,224 A | 1/1998 | Murota et al. ........... | 427/248.1 |
| 5,707,880 A | 1/1998 | Aftergut et al. ................ | 437/3 |
| 5,711,811 A | 1/1998 | Suntola et al. .............. | 118/711 |
| 5,730,801 A | 3/1998 | Tepman et al. ............. | 118/719 |
| 5,730,802 A | 3/1998 | Ishizumi et al. ............ | 118/719 |
| 5,744,394 A | 4/1998 | Iguchi et al. ................ | 438/276 |
| 5,747,113 A | 5/1998 | Tsai ....................... | 427/255.5 |
| 5,749,974 A | 5/1998 | Habuka et al. .............. | 118/725 |
| 5,788,447 A | 8/1998 | Yonemitsu et al. ......... | 414/217 |
| 5,788,799 A | 8/1998 | Steger et al. ................ | 156/345 |
| 5,796,116 A | 8/1998 | Nakata et al. ................ | 257/66 |
| 5,801,634 A | 9/1998 | Young et al. ............... | 340/635 |
| 5,807,792 A | 9/1998 | Ilg et al. ..................... | 438/758 |
| 5,830,270 A | 11/1998 | McKee et al. .............. | 117/106 |
| 5,835,677 A | 11/1998 | Li et al. ..................... | 392/401 |
| 5,851,849 A | 12/1998 | Comizzoli et al. ............ | 438/38 |
| 5,855,675 A | 1/1999 | Doering et al. ............. | 118/719 |
| 5,855,680 A | 1/1999 | Soininen et al. ............ | 118/719 |
| 5,856,219 A | 1/1999 | Naito et al. ................. | 438/241 |
| 5,858,102 A | 1/1999 | Tsai ........................... | 118/719 |
| 5,866,213 A | 2/1999 | Foster et al. ................ | 427/573 |
| 5,866,795 A | 2/1999 | Wang et al. .................. | 73/1.36 |
| 5,879,459 A | 3/1999 | Gadgil et al. ............... | 118/715 |
| 5,882,165 A | 3/1999 | Maydan et al. ............. | 414/217 |
| 5,882,413 A | 3/1999 | Beaulieu et al. ............ | 118/719 |
| 5,904,565 A | 5/1999 | Nguyen et al. ............. | 438/687 |
| 5,913,147 A | 6/1999 | Dubin et al. ................ | 438/687 |
| 5,916,365 A | 6/1999 | Sherman ...................... | 117/92 |
| 5,923,056 A | 7/1999 | Lee et al. .................... | 257/192 |
| 5,923,985 A | 7/1999 | Aoki et al. .................. | 438/301 |
| 5,925,574 A | 7/1999 | Aoki et al. ................... | 437/31 |
| 5,928,389 A | 7/1999 | Jevtic ....................... | 29/25.01 |
| 5,942,040 A | 8/1999 | Kim et al. ................... | 118/726 |
| 5,947,710 A | 9/1999 | Cooper et al. ................ | 418/63 |
| 5,972,430 A | 10/1999 | DiMeo, Jr. et al. ..... | 427/255.32 |
| 6,001,669 A | 12/1999 | Gaines et al. ............... | 438/102 |
| 6,015,590 A | 1/2000 | Suntola et al. .......... | 427/255.23 |
| 6,025,627 A | 2/2000 | Forbes et al. ................ | 257/321 |
| 6,036,773 A | 3/2000 | Wang et al. ................... | 117/97 |
| 6,037,257 A | 3/2000 | Chiang et al. .............. | 438/687 |
| 6,042,652 A | 3/2000 | Hyun et al. ................. | 118/719 |
| 6,043,177 A | 3/2000 | Falconer et al. ................ | 502/4 |
| 6,051,286 A | 4/2000 | Zhao et al. ................. | 427/576 |
| 6,062,798 A | 5/2000 | Muka ......................... | 414/416 |
| 6,066,892 A | 5/2000 | Ding et al. .................. | 257/751 |
| 6,071,808 A | 6/2000 | Merchant et al. ........... | 438/633 |
| 6,084,302 A | 7/2000 | Sandhu ....................... | 257/751 |
| 6,086,677 A | 7/2000 | Umotoy et al. ............. | 118/715 |
| 6,110,556 A | 8/2000 | Bang et al. ................. | 428/64.1 |
| 6,113,977 A | 9/2000 | Soininen et al. .............. | 427/64 |
| 6,117,244 A | 9/2000 | Bang et al. .................. | 118/715 |
| 6,124,158 A | 9/2000 | Dautartas et al. ........... | 438/216 |
| 6,130,147 A | 10/2000 | Major et al. ................ | 438/604 |
| 6,139,700 A | * 10/2000 | Kang et al. .................. | 204/192 |
| 6,140,237 A | 10/2000 | Chan et al. .................. | 438/687 |
| 6,140,238 A | 10/2000 | Kitch ......................... | 438/687 |
| 6,143,659 A | 11/2000 | Leem .......................... | 438/688 |
| 6,144,060 A | 11/2000 | Park et al. ................... | 257/310 |
| 6,158,446 A | 12/2000 | Mohindra et al. ........... | 134/25.4 |
| 6,160,315 A | 12/2000 | Chiang et al. .............. | 257/762 |
| 6,174,377 B1 | 1/2001 | Doering et al. ............. | 118/729 |
| 6,174,809 B1 | 1/2001 | Kang et al. .................. | 438/682 |
| 6,200,893 B1 | 3/2001 | Sneh ........................... | 438/685 |
| 6,203,613 B1 | 3/2001 | Gates et al. ................. | 117/104 |
| 6,206,967 B1 | 3/2001 | Mak et al. ................... | 118/666 |
| 6,207,302 B1 | 3/2001 | Sugiura et al. .............. | 428/690 |
| 6,242,808 B1 | 6/2001 | Shimizu et al. ............. | 257/762 |
| 6,248,605 B1 | 6/2001 | Harkonen et al. ............. | 438/29 |
| 6,249,055 B1 | 6/2001 | Dubin ......................... | 257/758 |
| 6,268,291 B1 | 7/2001 | Andricacos et al. ......... | 438/694 |
| 6,270,572 B1 | 8/2001 | Kim et al. .................... | 117/93 |

| | | | | |
|---|---|---|---|---|
| 6,271,148 B1 | 8/2001 | Kao et al. ............... 438/727 |
| 6,287,965 B1 | 9/2001 | Kang et al. ............... 438/648 |
| 6,291,876 B1 | 9/2001 | Stumborg et al. .......... 257/632 |
| 6,305,314 B1 | 10/2001 | Sneh et al. ............ 118/723 R |
| 6,306,216 B1 | 10/2001 | Kim et al. ............... 118/725 |
| 6,316,098 B1 | 11/2001 | Yitzchaik et al. .......... 428/339 |
| 6,387,806 B1 * | 5/2002 | Wang et al. ............... 438/687 |
| 6,610,151 B1 * | 8/2003 | Cohen ...................... 118/719 |
| 2001/0000866 A1 | 5/2001 | Sneh et al. ............ 118/723 R |
| 2001/0009140 A1 | 7/2001 | Bondestam et al. ........ 118/725 |
| 2001/0011526 A1 | 8/2001 | Doering et al. ............ 118/729 |
| 2001/0031562 A1 | 10/2001 | Raaijmakers et al. ...... 438/770 |
| 2001/0034123 A1 | 10/2001 | Jeon et al. ............... 438/643 |
| 2001/0041250 A1 | 11/2001 | Werkhoven et al. ....... 428/212 |
| 2001/0042799 A1 | 11/2001 | Kim et al. ............... 239/553 |

FOREIGN PATENT DOCUMENTS

| | | | | |
|---|---|---|---|---|
| EP | 0 344 352 A1 | 6/1988 | .......... H01L/39/24 |
| EP | 0 442 290 A1 | 2/1991 | .......... C30B/25/02 |
| EP | 0 429 270 A2 | 5/1991 | ............ C03F/7/36 |
| EP | 0 799 641 A2 | 10/1997 | ........... B01J/20/32 |
| EP | 0 954 027 | 11/1999 | ........ H01L/23/532 |
| FR | 2 626 110 | 7/1989 | ........ H01L/39/24 |
| FR | 2 692 597 | 12/1993 | ......... C23C/16/00 |
| GB | 2 355 727 A | 5/2001 | ......... C23C/16/44 |
| JP | 58-098917 | 6/1983 | ......... H01L/21/205 |
| JP | 58-100419 | 6/1983 | ......... H01L/21/20 |
| JP | 60-065712 A | 4/1985 | ......... C01B/33/113 |
| JP | 61-035847 | 2/1986 | ......... B01J/19/08 |
| JP | 61210623 | 9/1986 | ......... H01L/21/205 |
| JP | 62-069508 | 3/1987 | ......... H01L/21/203 |
| JP | 62-091495 A | 4/1987 | ......... C30B/25/02 |
| JP | 62-141717 | 6/1987 | ......... H01L/21/203 |
| JP | 62-167297 | 7/1987 | ......... C30B/29/40 |
| JP | 62-171999 | 7/1987 | ......... C30B/29/40 |
| JP | 62-232919 | 10/1987 | ......... H01L/21/205 |
| JP | 63-062313 | 3/1988 | ......... H01L/21/203 |
| JP | 63-085098 | 4/1988 | ......... C30B/21/40 |
| JP | 63-090833 | 4/1988 | ......... H01L/21/365 |
| JP | 63-222420 | 9/1988 | ......... H01L/21/205 |
| JP | 63-222421 | 9/1988 | ......... H01L/21/205 |
| JP | 63-227007 | 9/1988 | ......... H01L/21/205 |
| JP | 63-252420 | 10/1988 | ......... H01L/21/205 |
| JP | 63-266814 | 11/1988 | ......... H01L/21/205 |
| JP | 64-009895 | 1/1989 | ......... C30B/29/40 |
| JP | 64-009896 | 1/1989 | ......... C30B/29/40 |
| JP | 64-009897 | 1/1989 | ......... C30B/29/40 |
| JP | 64-037832 | 2/1989 | ......... H01L/21/205 |
| JP | 64-082615 | 3/1989 | ......... H01L/21/205 |
| JP | 64-082617 | 3/1989 | ......... H01L/21/205 |
| JP | 64-082671 | 3/1989 | ......... H01L/29/78 |
| JP | 64-082676 | 3/1989 | ......... H01L/29/80 |
| JP | 01-103982 | 4/1989 | ......... C30B/23/08 |
| JP | 01-103996 | 4/1989 | ......... C30B/29/40 |
| JP | 64-090524 | 4/1989 | ......... H01L/21/205 |
| JP | 01-117017 | 5/1989 | ......... H01L/21/203 |
| JP | 01-143221 | 6/1989 | ......... H01L/21/314 |
| JP | 01-143233 | 6/1989 | ......... H01L/21/76 |
| JP | 01-154511 | 6/1989 | ......... H01L/21/20 |
| JP | 01-236657 | 9/1989 | ......... H01L/29/80 |
| JP | 01-245512 | 9/1989 | ......... H01L/21/205 |
| JP | 01-264218 | 10/1989 | ......... H01L/21/205 |
| JP | 01-270593 | 10/1989 | ......... C30B/25/02 |
| JP | 01-272108 | 10/1989 | ......... H01L/21/203 |
| JP | 01-290221 | 11/1989 | ......... H01L/21/205 |
| JP | 01-290222 | 11/1989 | ......... H01L/21/20 |
| JP | 01-296673 | 11/1989 | ......... H01L/29/88 |
| JP | 01-303770 | 12/1989 | ......... H01L/39/24 |
| JP | 01-305894 | 12/1989 | ......... C30B/23/08 |
| JP | 01-313927 | 12/1989 | ......... H01L/21/205 |
| JP | 02-012814 | 1/1990 | ......... H01L/21/205 |
| JP | 02-014513 | 1/1990 | ......... H01L/21/205 |
| JP | 02-017634 | 1/1990 | ......... H01L/21/225 |
| JP | 02-063115 | 3/1990 | ......... H01L/21/20 |
| JP | 02-074029 | 3/1990 | ......... H01L/21/205 |
| JP | 02-074587 | 3/1990 | ......... C30B/23/08 |
| JP | 02-106822 | 4/1990 | ......... H01B/13/00 |
| JP | 02-129913 | 5/1990 | ......... H01L/21/205 |
| JP | 02-162717 | 6/1990 | ......... H01L/21/20 |
| JP | 02-172895 | 7/1990 | ......... C30B/29/36 |
| JP | 02-196092 | 8/1990 | ......... C30B/25/14 |
| JP | 02-203517 | 8/1990 | ......... H01L/21/205 |
| JP | 02-230690 | 9/1990 | ......... H05B/33/10 |
| JP | 02-230722 | 9/1990 | ......... H01L/21/205 |
| JP | 02-246161 | 10/1990 | ......... H01L/29/784 |
| JP | 02-264491 | 10/1990 | ......... H01S/3/18 |
| JP | 02-283084 | 11/1990 | ......... H01S/3/18 |
| JP | 02-304916 | 12/1990 | ......... H01L/21/205 |
| JP | 03-019211 | 1/1991 | ......... H01L/21/205 |
| JP | 03-022569 | 1/1991 | ......... H01L/29/804 |
| JP | 03-023294 | 1/1991 | ......... C30B/25/18 |
| JP | 03-023299 | 1/1991 | ......... C30B/29/40 |
| JP | 03-044967 | 2/1991 | ......... H01L/29/48 |
| JP | 03-048421 | 3/1991 | ......... H01L/21/302 |
| JP | 03-070124 | 3/1991 | ......... H01L/21/205 |
| JP | 03-185716 | 8/1991 | ......... H01L/21/205 |
| JP | 03-208885 | 9/1991 | ......... C30B/23/02 |
| JP | 03-234025 | 10/1991 | ......... H01L/21/318 |
| JP | 03-286522 | 12/1991 | ......... H01L/21/205 |
| JP | 03-286531 | 12/1991 | ......... H01L/21/316 |
| JP | 04-031391 | 2/1992 | ......... C30B/23/08 |
| JP | 04-031396 | 2/1992 | ......... C30B/25/14 |
| JP | 04-031396 A | 2/1992 | ......... C30B/25/14 |
| JP | 04-100292 | 4/1992 | ......... H01S/3/18 |
| JP | 04-111418 | 4/1992 | ......... H01L/21/205 |
| JP | 04-132214 | 5/1992 | ......... H01L/21/205 |
| JP | 04-132681 | 5/1992 | ......... C30B/25/14 |
| JP | 04/151822 | 5/1992 | ......... H01L/21/205 |
| JP | 04-162418 | 6/1992 | ......... H01L/21/205 |
| JP | 04-175299 | 6/1992 | ......... C30B/29/68 |
| JP | 04-186824 | 7/1992 | ......... H01L/21/205 |
| JP | 04-212411 | 8/1992 | ......... H01L/21/203 |
| JP | 04-260696 | 9/1992 | ......... C30B/29/40 |
| JP | 04-273120 | 9/1992 | ......... H01L/21/20 |
| JP | 04-285167 | 10/1992 | ......... C23C/14/54 |
| JP | 04-291916 | 10/1992 | ......... H01L/21/205 |
| JP | 04-325500 | 11/1992 | ......... C30B/33/00 |
| JP | 04-328874 | 11/1992 | ......... H01L/29/804 |
| JP | 05-029228 | 2/1993 | ......... H01L/21/205 |
| JP | 05-047665 | 2/1993 | ......... H01L/21/205 |
| JP | 05-047666 | 2/1993 | ......... H01L/21/205 |
| JP | 05-047668 | 2/1993 | ......... H01L/21/205 |
| JP | 05-074717 | 3/1993 | ......... H01L/21/205 |
| JP | 05-074724 | 3/1993 | ......... H01L/21/205 |
| JP | 05-102189 | 4/1993 | ......... H01L/21/336 |
| JP | 05-160152 | 6/1993 | ......... H01L/21/336 |
| JP | 05-175143 | 7/1993 | ......... H01L/21/205 |
| JP | 05-175145 | 7/1993 | ......... H01L/21/20 |
| JP | 05-182906 | 7/1993 | ......... H01L/21/20 |
| JP | 05-186295 | 7/1993 | ......... C30B/25/02 |
| JP | 05-206036 | 8/1993 | ......... H01L/21/205 |
| JP | 05-234899 | 9/1993 | ......... H01L/21/205 |
| JP | 05-235047 | 9/1993 | ......... H01L/21/338 |
| JP | 05-251339 | 9/1993 | ......... H01L/21/20 |
| JP | 05-270997 | 10/1993 | ......... C30B/29/68 |
| JP | 05-283336 | 10/1993 | ......... H01L/21/20 |
| JP | 05-291152 | 11/1993 | ......... H01L/21/205 |
| JP | 05-304334 | 11/1993 | ......... H01L/3/18 |
| JP | 05-343327 | 12/1993 | ......... H01L/21/205 |
| JP | 05-343685 | 12/1993 | ......... H01L/29/784 |
| JP | 06-045606 | 2/1994 | ......... H01L/29/784 |
| JP | 06-132236 | 5/1994 | ......... H01L/21/205 |

| | | | |
|---|---|---|---|
| JP | 06-177381 | 6/1994 | H01L/29/784 |
| JP | 06-196809 | 7/1994 | H01S/3/18 |
| JP | 06-222388 | 8/1994 | G02F/1/136 |
| JP | 06-224138 | 8/1994 | H01L/21/205 |
| JP | 06-230421 | 8/1994 | G02F/1/136 |
| JP | 06-252057 | 9/1994 | H01L/21/205 |
| JP | 06-291048 | 10/1994 | H01L/21/205 |
| JP | 07-070752 | 3/1995 | C23C/16/40 |
| JP | 07-086269 | 3/1995 | H01L/21/314 |
| JP | 08-181076 | 7/1996 | H01L/21/205 |
| JP | 08-245291 | 9/1996 | C30B/25/14 |
| JP | 08-264530 | 10/1996 | H01L/21/3205 |
| JP | 09-260786 | 10/1997 | H01S/3/18 |
| JP | 09-293681 | 11/1997 | H01L/21/205 |
| JP | 10-188840 | 7/1998 | H01J/29/18 |
| JP | 10-190128 | 7/1998 | H01S/3/18 |
| JP | 10-308283 | 11/1998 | H05B/33/22 |
| JP | 11-269652 | 10/1999 | C23C/16/44 |
| JP | 2000-031387 | 1/2000 | H01L/27/04 |
| JP | 2000-058777 | 2/2000 | H01L/27/108 |
| JP | 2000-068072 | 3/2000 | H05B/33/22 |
| JP | 2000-087029 | 3/2000 | C09K/11/08 |
| JP | 2000-319772 | 3/2000 | C23C/16/00 |
| JP | 2000-138094 | 5/2000 | H05B/33/10 |
| JP | 2000-218445 | 8/2000 | B23P/6/00 |
| JP | 2000-319772 | 11/2000 | C23C/14/24 |
| JP | 2000-340883 | 12/2000 | H01S/5/125 |
| JP | 2000-353666 | 12/2000 | H01L/21/205 |
| JP | 2001-020075 | 1/2001 | C23C/16/44 |
| JP | 2001-62244 | 3/2001 | B01D/53/34 |
| JP | 2001-152339 | 6/2001 | C23C/16/40 |
| JP | 2001-172767 | 6/2001 | C23C/16/40 |
| JP | 2001-189312 | 7/2001 | H01L/21/316 |
| JP | 2001-217206 | 8/2001 | H01L/21/285 |
| JP | 2001-220287 | 8/2001 | C30B/25/02 |
| JP | 2001-220294 | 8/2001 | C30B/29/20 |
| JP | 2001-240972 | 9/2001 | C23C/16/458 |
| JP | 2001-254181 | 9/2001 | C23C/16/46 |
| JP | 2001-284042 | 10/2001 | H05B/33/04 |
| JP | 2001-303251 | 10/2001 | C23C/16/44 |
| JP | 2001-328900 | 11/2001 | C30B/29/68 |
| WO | 90/02216 | 3/1990 | C23C/14/34 |
| WO | 91/10510 A1 | 7/1991 | B01J/37/02 |
| WO | 93/02111 A1 | 2/1993 | C08F/4/78 |
| WO | 96/17107 A1 | 6/1996 | C23C/16/44 |
| WO | 96/18756 A1 | 6/1996 | C23C/16/08 |
| WO | 98/06889 | 2/1998 | |
| WO | 98/51838 | 11/1998 | C23C/16/06 |
| WO | 99/13504 | 3/1999 | H01L/21/68 |
| WO | 99/29924 A1 | 6/1999 | C23C/16/04 |
| WO | 99/41423 A2 | 8/1999 | |
| WO | 00//11721 | 3/2000 | H01L/29/43 |
| WO | 00/15865 A1 | 3/2000 | C23C/16/00 |
| WO | 00/15881 A2 | 3/2000 | |
| WO | 00/16377 A2 | 3/2000 | |
| WO | 00/54320 A1 | 9/2000 | H01L/21/44 |
| WO | 00/63957 A1 | 10/2000 | H01L/21/205 |
| WO | WO 00/75964 | 12/2000 | |
| WO | 00/79019 A1 | 12/2000 | C23C/16/00 |
| WO | 00/79576 A1 | 12/2000 | H01L/21/205 |
| WO | 01/15220 | 3/2001 | H01L/21/768 |
| WO | 01/15220 A1 | 3/2001 | H01L/21/768 |
| WO | 01/27346 A1 | 4/2001 | C23C/16/44 |
| WO | 01/27347 A1 | 4/2001 | C23C/16/44 |
| WO | 01/29280 A1 | 4/2001 | C23C/16/32 |
| WO | 01/29891 A1 | 4/2001 | H01L/21/768 |
| WO | 01/29893 A1 | 4/2001 | H01L/21/768 |
| WO | 01/36702 A1 | 5/2001 | C23C/16/00 |
| WO | 01/40541 A1 | 6/2001 | C23C/16/40 |
| WO | 01/66832 A2 | 9/2001 | C30B/16/44 |

OTHER PUBLICATIONS

Ohba, et al., "Thermal Decomposition of Methylhydrazine and Deposition Properties of CVD TiN Thin Films", Conference Proceedings, Advanced Metallization for ULSI Applications in 1993 (1994), pp. 143–149.

Scheper, et al., "Low–temperature deposition of titanium nitride films from diakylhydrazine–based precursors", Materials Science in Semiconductor Processing 2 (1999), pp. 149–157.

Suzuki, et al., "0.2–$\mu$m contact filing by 450°C–hydrazine–reduced TiN film with low resistivity", IEDM 92–979, pp. 11.8.–1–11.8.3.

Suzuki, et al., "LPCVD–TiN Using Hydrazine and $TiCl_4$", VMIC Conference (Jun. 8–9, 1993), pp. 418–423.

IBM Tech. Disc. Bull. Knowledge–Based Dynamic Scheduler in Distributed Computer Control, (Jun. 1990), pp. 80–84.

IBM Tech. Disc. Bull. "Multiprocessor and Multitasking Architecture for Tool Control of the Advanced via Inspection Tools" (May 1992), pp. 190–191.

McGeachin, S., "Synthesis and properties of some $\beta$–diketimines derived from acetylacetone, and their metal complexes", Canadian J. of Chemistry, vol. 46 (1968), pp. 1903–1912.

Solanki, et al., "Atomic Layer deposition of Copper Seed Layers", Electrochemical and Solid State Letters, 3(10) (2000), pp. 479–480.

NERAC.COM Retro Search: Atomic Layer Deposition of Copper, dated Oct. 11, 2001.

NERAC.COM Retro Search: Atomic Layer Deposition/ Epitaxy Aluminum Oxide Plasma, dated Oct. 2, 2001.

NERAC Search abstract of "Atomic Layer depositon of Ta and Ti for Interconnect Diffusion Barriers", by Rossnagel, et al., J. Vac. Sci. & Tech., 18(4) (Jul. 2000).

Abstracts of articles re atomic layer deposition.

Abstracts of search results re atomic layer deposition, search dated Jan. 24, 2002.

Abstracts of articles re atomic layer deposition and atomic layer nucleation.

Abstracts of articles re atomic layer deposition and semiconductors and copper.

Abstracts of articles—atomic layer deposition.

NERAC Search—Atomic Layer Deposition, search dated Oct. 16, 2001.

Bader, et al.; "Integrated Processing Equipment", Solid State Technology, Cowan Pub., vol. 33, No. 5 (May 1, 1990), pp. 149–154.

Choi, et al., "The effect of annealing on resistivity of low pressure chemical vapor depositied titanium diboride", J. Appl. Phys. 69(11) (Jun. 1, 1991), pp. 7853–7861.

Choi, et al., "Stability of $TiB_2$ as a Diffusion Barrier on Silicon", J. Electrochem. Soc. 138(10) (Oct. 1991), pp. 3062–3067.

"Cluster Tools for Fabrication of Advanced devices" Jap. J. of Applied Physics, Extended Abstracts, $22^{nd}$ Conference Solid State Devices and Materials (1990), pp. 849–852 XP000178141.

"Applications of Integrated processing", Solid State Technology, US, Cowan Pub., vol. 37, No. 12 (Dec. 1, 1994), pp. 45–47.

Kitigawa, et al., "Hydrogen–mediated low temperature epitaxy of Si in plasma–enhanced chemical vapor deposition", Applied Surface Science (2000), pp. 30–34.

Lee, et al., "Pulsed nucleation of ultra–high aspect ratio tungsten plugfill", Novellus Systems, Inc. (2001), pp. 1–2.

U.S. Appl. No. 09/518,004, filed Mar. 2, 2000.

Hultman, et al., "Review of the thermal and mechanical stability of TiN–based thin films", *Zeitschrit Fur Metalkunde*, 90(10) (Oct. 1999), pp. 803–813.

Klaus, et al., "Atomic Layer Deposition of $SiO_2$ Using Catalyzed and Uncatalyzed Self–Limiting Surface Reactions", *Surface Review & Letters*, 6(3&4) (1999), pp. 435–448.

Yamaguchi, et al., "Atomic–layer chemical–vapor–deposition of sillcon dioxide films with extremely low hydrogen content", *Appl. Surf. Sci.*, vol. 130–132 (1998), pp. 202–207.

George, et al., "Surface Chemistry for Atomic Lay r Growth", *J. Phys. Chem.*, vol. 100 (1996), 13121–13131.

George, et al., "Atomic layer controlled deposition of $SIO_2$ and $Al_2O_3$ using ABAB . . . binary reaction sequence chemistry", *Appl. Surf. Sci.*, vol. 82/83 (1994), pp. 460–467.

Wise, et al., "Diethyldiethoxysilane as a new precursor for $SiO_2$ growth on silicon", *Mat. Res. Soc. Symp. Proc.*, vol. 334 (1994), pp. 37–43.

Niinisto, et al., "Synthesis of oxide thin films and overlayers by atomic layer epitaxy for advanced applications", *Mat. Sci. & Eng.*, vol. B41 (1996), pp. 23–29.

Ritala, et al., "Perfectly conformal TiN and $Al_2O_3$ films deposited by atomic layer deposition", *Chemical Vapor Deposition*, vol. 5(1) (Jan. 1999), pp. 7–9.

Klaus, et al., "Atomically controlled growth of tungsten and tungsten nitride using sequential surface reactions", *Appl. Surf. Sci.*, vol. 162–163 (2000), pp. 479–491.

Min, et al., "Atomic layer deposition of TiN thin films by sequential introduction of Ti precursor and NH/sub3/", Symp.: *Advanced Interconnects and Contact Materials and Processes for Future Integrated Circuits* (Apr. 13–16, 1998), pp. 337–342.

Klaus, et el., Atomic Layer Deposition of Tungsten using Sequential Surface Chemistry with a Sacrificial Stripping Reaction, Thin Solid Films 360 (2000), pp. 145–153, (Accepted Nov. 16, 1999).

Min, et al., "Metal–Organic Atomic–Layer Deposition of Titanium–Silicon–Nitride Films", *Applied Physics Letters*, American Inst. Of Physics, vol. 75(11) (Sep. 13, 1999).

Martensson, et al., "Atomic Layer Epitaxy of Copper on Tantalum", *Chemical Vapor Deposition*, 3(1) (Feb. 1, 1997), pp. 45–50.

Ritala, et al. "Atomic Layer Epitaxy Growth of TiN Thin Films", *J. Electrochem. Soc.*, 142(8) (Aug. 1995), pp. 2731–2737.

Elers, et al., "NbC15 as a precursor in atomic layer epitaxy", *Appl Surf. Sci.*, vol. 82/83 (1994), pp. 468–474.

Lee, "The Preparation of Titanium–Based Thin Film by CVD Using Titanium Chlorides as Precursors", *Chemical Vapor Deposition*, 5(2) (Mar. 1999), pp. 69–73.

Martensson, et al., "Atomic Layer Epitaxy of Copper, Growth & Selectivity in the Cu (II)–2,2.6,6–Tetramethyl–3, 5–Heptanedion ATE/H2 Process", *J. Electrochem. Soc.*, 145(8) (Aug. 1998), pp. 2926–2931.

Min, et al., "Chemical Vapor Deposition of Ti–Si–N Films with Alternating Source Supply", *Mat. Res. Soc. Symp. Proc.*, vol. 564 (Apr. 5, 1999), pp. 207–210.

Bedair, "Atomic layer epitaxy deposition processes", *J. Vac. Sci. Technol.* 12(1) (Jan./Feb.1994).

Yamaga, et al., "Atomic layer epitaxy of ZnS by a new gas supplying system in a low–pressure metalorganic vapor phase epitaxy", *J. of Crystal Growth* 117 (1992), pp. 152–155.

Elam, et al., "Nucleation and growth during tungsten atomic layer deposition on SiO2 surface," Thin Solid Films 386 (2001) pp. 41–52, (Accepted Dec. 14, 2000).

* cited by examiner

INTEGRATION OF BARRIER LAYER AND SEED LAYER

BACKGROUND OF THE INVENTION

1. Field of the Invention

The present invention generally relates to an apparatus and method of depositing a barrier layer and a seed layer over the barrier layer. More particularly, the present invention relates to an apparatus and method of depositing a barrier layer and depositing a seed layer comprising copper and another metal over the barrier layer.

2. Description of the Related Art

Reliably producing sub-micron and smaller features is one of the key technologies for the next generation of very large scale integration (VLSI) and ultra large scale integration (ULSI) of semiconductor devices. However, as the fringes of circuit technology are pressed, the shrinking dimensions of interconnects in VLSI and ULSI technology have placed additional demands on the processing capabilities. The multilevel interconnects that lie at the heart of this technology require precise processing of high aspect ratio features, such as vias and other interconnects. Reliable formation of these interconnects is very important to VLSI and ULSI success and to the continued effort to increase circuit density and quality of individual substrates.

As circuit densities increase, the widths of vias, contacts and other features, as well as the dielectric materials between them, decrease to sub-micron dimensions (e.g., less than 0.20 micrometers or less), whereas the thickness of the dielectric layers remains substantially constant, with the result that the aspect ratios for the features, i.e., their height divided by width, increase. Many traditional deposition processes have difficulty filling sub-micron structures where the aspect ratio exceeds 4:1, and particularly where the aspect ratio exceeds 10:1. Therefore, there is a great amount of ongoing effort being directed at the formation of substantially void-free and seam-free sub-micron features having high aspect ratios.

Currently, copper and its alloys have become the metals of choice for sub-micron interconnect technology because copper has a lower resistivity than aluminum, (1.7 $\mu\Omega$-cm compared to 3.1 $\mu\Omega$-cm for aluminum), and a higher current carrying capacity and significantly higher electromigration resistance. These characteristics are important for supporting the higher current densities experienced at high levels of integration and increased device speed. Further, copper has a good thermal conductivity and is available in a highly pure state.

Copper metallization can be achieved by a variety of techniques. A typical method generally comprises physical vapor depositing a barrier layer over a feature, physical vapor depositing a copper seed layer over the barrier layer, and then electroplating a copper conductive material layer over the copper seed layer to fill the feature. Finally, the deposited layers and the dielectric layers are planarized, such as by chemical mechanical polishing (CMP), to define a conductive interconnect feature.

However, one problem with the use of copper is that copper diffuses into silicon, silicon dioxide, and other dielectric materials which may compromise the integrity of devices. Therefore, conformal barrier layers become increasingly important to prevent copper diffusion. Tantalum nitride has been used as a barrier material to prevent the diffusion of copper into underlying layers. One problem with prior uses of tantalum nitride and other barrier layers, however, is that these barrier layers are poor wetting agents for the deposition of copper thereon which may cause numerous problems. For example, during deposition of a copper seed layer over these barrier layers, the copper seed layer may agglomerate and become discontinuous, which may prevent uniform deposition of a copper conductive material layer (i.e. electroplating of a copper layer) over the copper seed layer. In another example, subsequent processing at high temperatures of a substrate structure having a copper layer deposited over these barrier layers may cause dewetting and the formation of voids in the copper layer. In still another example, thermal stressing of formed devices through use of the devices may cause the generation of voids in the copper layer and device failure. Thus, there is a need for an improved interconnect structure and method of depositing the interconnect structure.

SUMMARY OF THE INVENTION

The present invention generally relates to filling of a feature by depositing a barrier layer, depositing a seed layer over the barrier layer, and depositing a conductive layer over the seed layer. In one embodiment, the seed layer comprises a copper alloy seed layer deposited over the barrier layer. For example, the copper alloy seed layer may comprise copper and a metal, such as aluminum, magnesium, titanium, zirconium, tin, and combinations thereof. In another embodiment, the seed layer comprises a copper allloy seed layer deposited over the barrier layer and a second seed layer deposited over the copper alloy seed layer. The copper alloy seed layer may comprise copper and a metal, such as aluminum, magnesium, titanium, zirconium, tin, and combinations thereof. The second seed layer may comprise a metal, such as undoped copper. In still another embodiment, the seed layer comprises a first seed layer and a second seed layer. The first seed layer may comprise a metal, such as aluminum, magnesium, titanium, zirconium, tin, and combinations thereof. The second seed layer may comprise a metal, such as undoped copper.

BRIEF DESCRIPTION OF THE DRAWINGS

So that the manner in which the above recited features, advantages and objects of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

Process Chamber Adapted for Depositing a Barrier Layer

Figure 1:
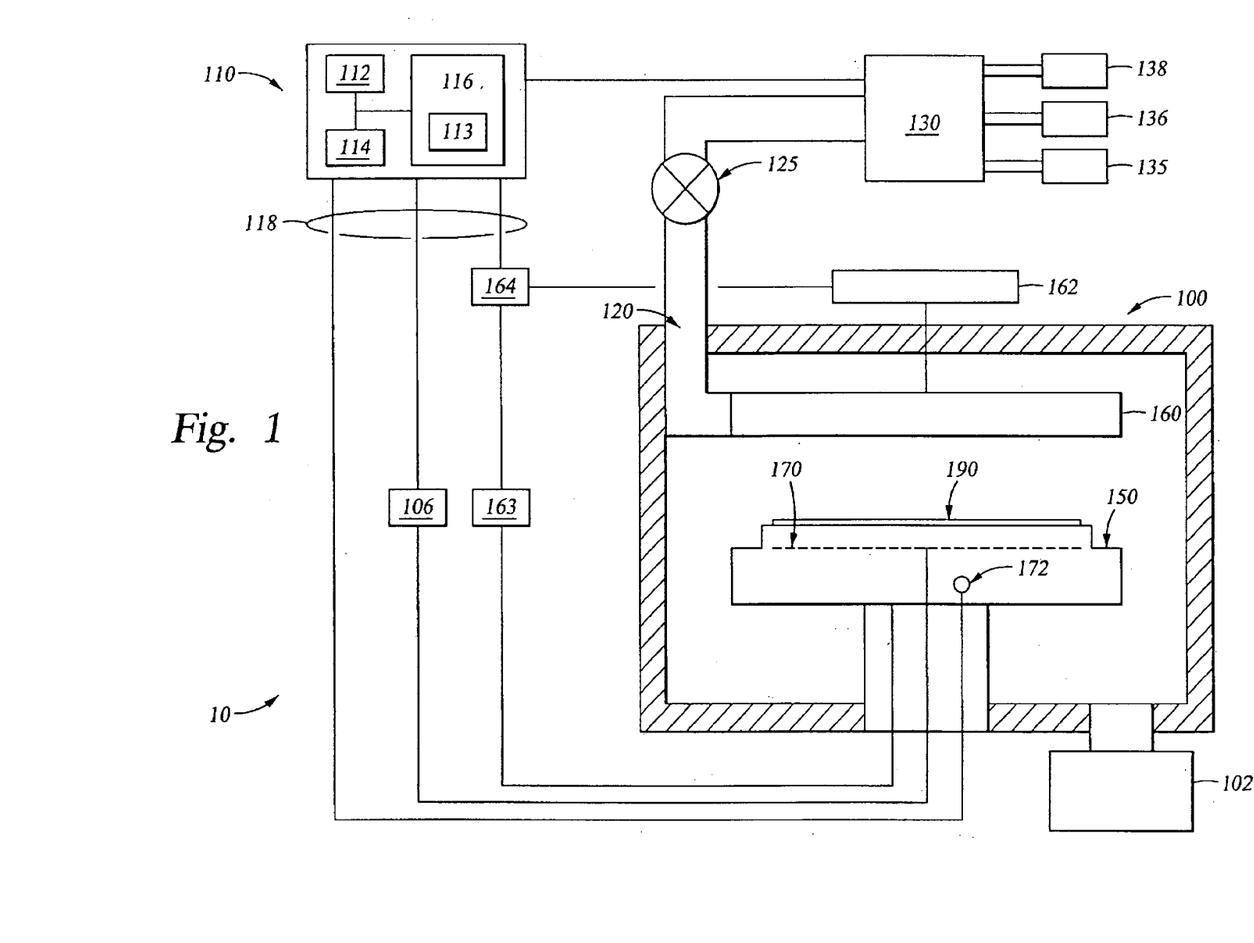
FIG. 1 is a schematic cross-sectional view of one embodiment of a processing system that may be used to form one or more barrier layers by atomic layer deposition.

FIG. 1 is a schematic cross-sectional view of one exemplary embodiment of a processing system 10 that may be used to form one or more barrier layers by atomic layer deposition in accordance with aspects of the present invention. Of course, other processing systems may also be used.

The process system 10 generally includes a process chamber 100, a gas panel 130, a control unit 110, a power supply 106, and a vacuum pump 102. The process chamber 100 generally houses a support pedestal 150, which is used to support a substrate such as a semiconductor wafer 190 within the process chamber 100.

In the chamber 100, the support pedestal 150 may be heated by an embedded heating element 170. For example, the pedestal 150 may be resistively heated by applying an electric current from an AC power supply to the heating element 170. The wafer 190 is, in turn, heated by the pedestal 150, and may be maintained within a desired process temperature range, for example, between about 20° C. and about 1000° C. depending on the specific process.

A temperature sensor 172, such as a thermocouple, may be embedded in the wafer support pedestal 150 to monitor the pedestal temperature. For example, the measured temperature may be used in a feedback loop to control electric current applied to the heating element 170 from the power supply 106, such that the wafer temperature can be maintained or controlled at a desired temperature or within a desired temperature range suitable for a certain process application. The pedestal 150 may also be heated using radiant heat (not shown) or other heating methods.

The vacuum pump 102 may be used to evacuate process gases from the process chamber 100 and may be used to help maintain a desired pressure or desired pressure within a pressure range inside the chamber 100. An orifice 120 through a wall of the chamber 100 is used to introduce process gases into the process chamber 100. The size of the orifice 120 conventionally depends on the size of the process chamber 100.

The orifice 120 is coupled to the gas panel 130 in part by a valve 125. The gas panel 130 may be configured to receive and then provide a resultant process gas from two or more gas sources 135, 136 to the process chamber 100 through the orifice 120 and the valve 125. The gas sources 135, 136 may store precursors in a liquid phase at room temperature, which are later heated when in the gas panel 130 to convert them to a vapor-gas phase for introduction into the chamber 100. The gas sources 135, 136 may also be adapted to provide precursors through the use of a carrier gas. The gas panel 130 may be further configured to receive and then provide a purge gas from a purge gas source 138 to the process chamber 100 through the orifice 120 and the valve 125. A showerhead 160 may be coupled to the orifice 120 to deliver a process gas, purge gas, or other gas toward the wafer 190 on the support pedestal 150.

The showerhead 160 and the support pedestal 150 may serve as spaced apart electrodes for providing an electric field for igniting a plasma. A RF power source 162 may be coupled to the showerhead 160, a RF power source 163 may be coupled to the support pedestal 150, or RF power sources 162, 163 may be coupled to the showerhead 160 and the support pedestal 150, respectively. A matching network 164 may be coupled to the RF power sources 162, 163, which may be coupled to the control unit 110 to control the power supplied to the RF power sources 162, 163.

The control unit 110, such as a programmed personal computer, work station computer, and the like, may also be configured to control flow of various process gases through the gas panel 130 as well as the valve 125 during different stages of a wafer process sequence. Illustratively, the control unit 110 comprises a central processing unit (CPU) 112, support circuitry 114, and memory 116 containing associated control software 113. In addition to control of process gases through the gas panel 130, the control unit 110 may be configured to be responsible for automated control of other activities used in wafer processing—such as wafer transport, temperature control, chamber evacuation, among other activities, some of which are described elsewhere herein.

The control unit 110 may be one of any form of general purpose computer processor that can be used in an industrial setting for controlling various chambers and sub-processors. The CPU 112 may use any suitable memory 116, such as random access memory, read only memory, floppy disk drive, hard disk, or any other form of digital storage, local or remote. Various support circuits may be coupled to the CPU 112 for supporting the system 10. Software routines 113 as required may be stored in the memory 116 or executed by a second computer processor that is remotely located (not shown). Bi-directional communications between the control unit 110 and various other components of the wafer processing system 10 are handled through numerous signal cables collectively referred to as signal buses 118, some of which are illustrated in FIG. 1.

Barrier Layer Formation

Figure 2A:
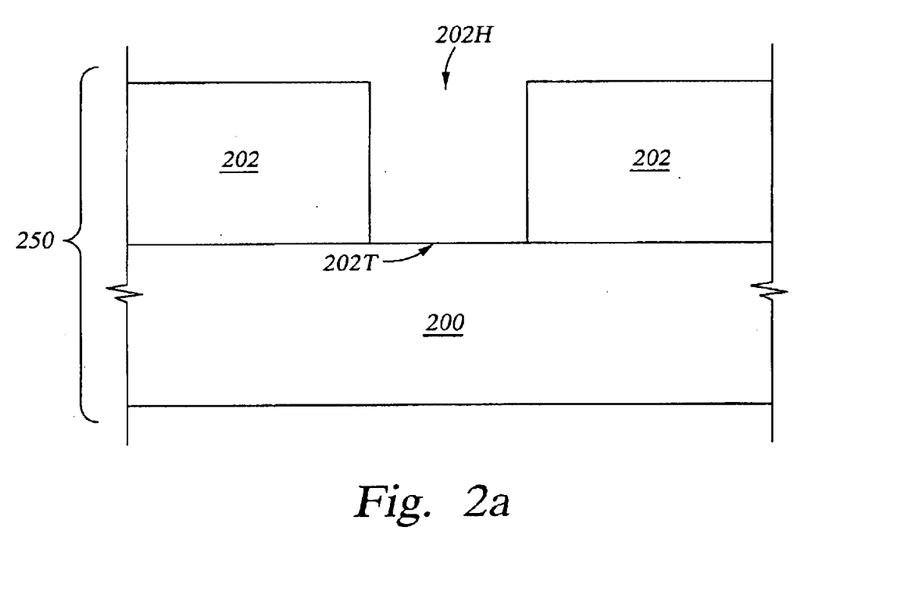
FIG. 2A is a schematic cross-sectional view of one embodiment of a substrate having a dielectric layer deposited thereon.
Figure 2B:
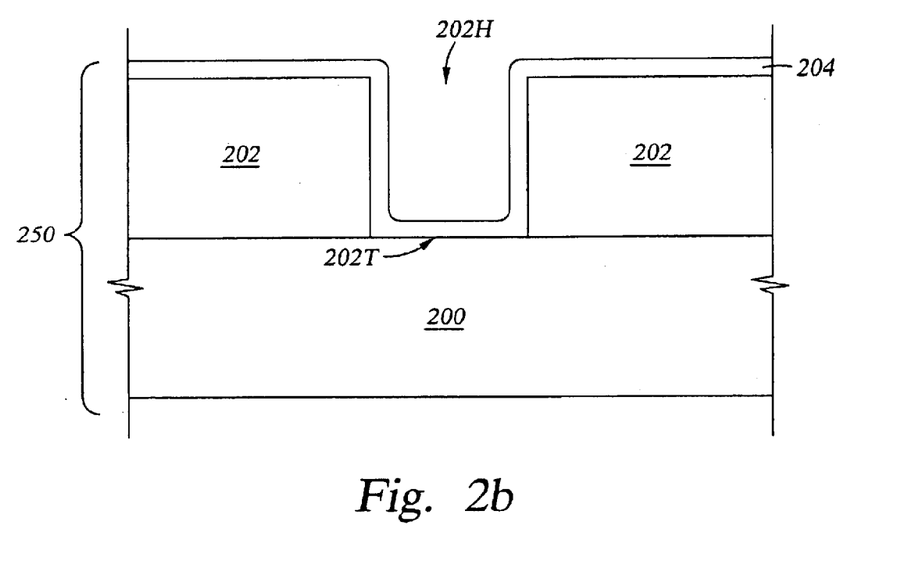
FIG. 2B is a schematic cross-sectional view of one embodiment of a barrier layer formed over the substrate structure of FIG. 2A.

The exemplary chamber as described in FIG. 1 may be used to implement the following process. Of course, other process chambers may be used. FIGS. 2A–2B illustrate one exemplary embodiment of barrier layer formation for fabrication of an interconnect structure in accordance with one or more aspects of the present invention.

FIG. 2A is a schematic cross-sectional view of one embodiment of a substrate 200 having a dielectric layer 202 deposited thereon. Depending on the processing stage, the substrate 200 may be a silicon semiconductor wafer, or other material layer, which has been formed on the wafer. The dielectric layer 202 may be an oxide, a silicon oxide, carbon-silicon-oxide, a fluoro-silicon, a porous dielectric, or other suitable dielectric formed and patterned to provide a contact hole or via 202H extending to an exposed surface portion 202T of the substrate 200. For purposes of clarity, the substrate 200 refers to any workpiece upon which film processing is performed, and a substrate structure 250 is used to denote the substrate 200 as well as other material layers formed on the substrate 200, such as the dielectric layer 202. It is also understood by those with skill in the art that the present invention may be used in a dual damascene process flow.

FIG. 2B is a schematic cross-sectional view of one embodiment of a barrier layer 204 formed over the substrate structure 250 of FIG. 2A by atomic layer deposition (ALD). Preferably, the barrier layer comprises a tantalum nitride layer. Examples of other barrier layer materials which may be used include titanium (Ti), titanium nitride (TiN), titanium silicon nitride (TiSiN), tantalum (Ta), tantalum silicon nitride (TaSiN), tungsten (W), tungsten nitride (WN), tungsten silicon nitride (WSiN), and combinations thereof.

For clarity reasons, deposition of the barrier layer will be described in more detail in reference to one embodiment of the barrier layer comprising a tantalum nitride barrier layer. In one aspect, atomic layer deposition of a tantalum nitride barrier layer comprises sequentially providing a tantalum containing compound and a nitrogen containing compound to a process chamber, such as the process chamber of FIG. 1. Sequentially providing a tantalum containing compound and a nitrogen containing compound may result in the alternating chemisorption of monolayers of a tantalum containing compound and of monolayers of a nitrogen containing compound on the substrate structure 250.

Figure 3A:
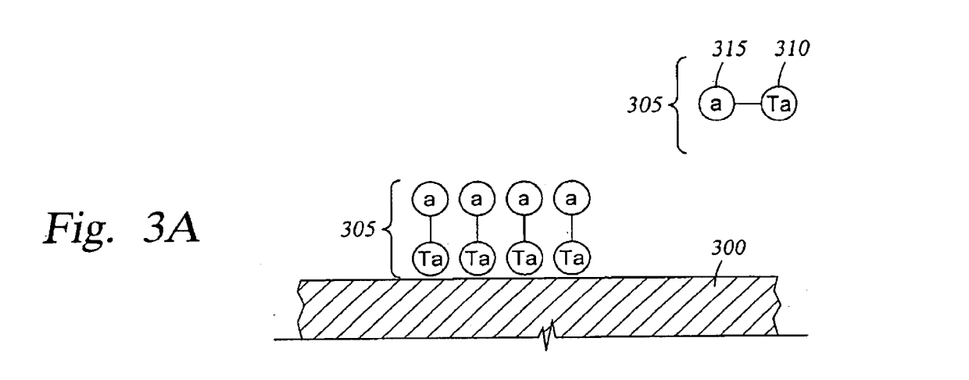
FIGS. 3A–C illustrate one embodiment of alternating chemisorption of monolayers of a tantalum containing compound and a nitrogen containing compound on a portion of substrate at a stage of barrier layer formation.
Figure 3B:
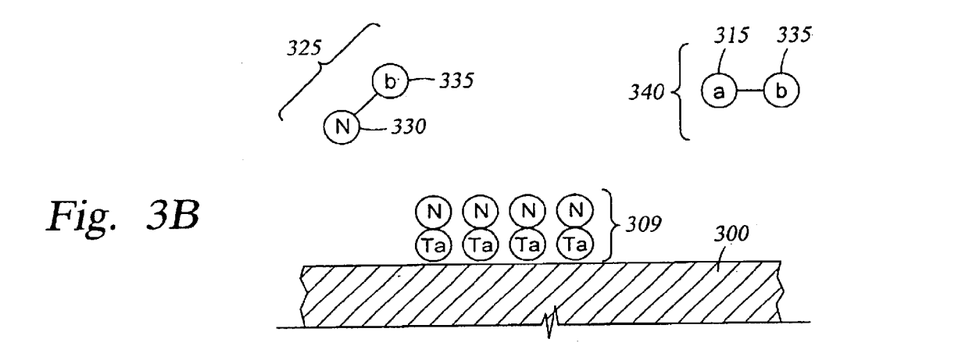
Figure 3C:
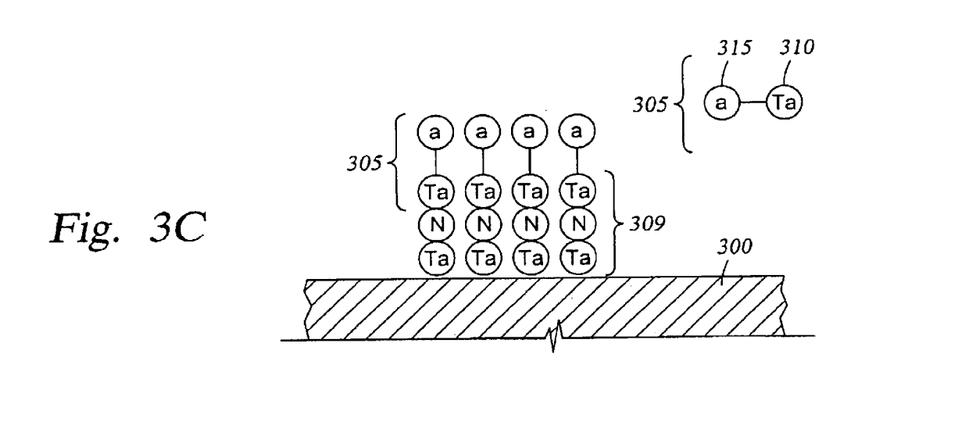

FIGS. 3A–C illustrate one embodiment of the alternating chemisorption of monolayers of a tantalum containing compound and a nitrogen containing compound on an exemplary portion of substrate 300 in a stage of integrated circuit fabrication, and more particularly at a stage of barrier layer formation. In FIG. 3A, a monolayer of a tantalum containing compound is chemisorbed on the substrate 300 by introducing a pulse of the tantalum containing compound 305 into a process chamber, such as a process chamber shown in FIG. 1. It is believed that the chemisorption processes used to absorb the monolayer of the tantalum containing compound 305 are self-limiting in that only one monolayer may be chemisorbed onto the surface of the substrate 300 during a given pulse because the surface of the substrate has a finite number of sites for chemisorbing the tantalum containing compound. Once the finite number of sites is occupied by the tantalum containing compound 305, further chemisorption of any tantalum containing compound will be blocked.

The tantalum containing compound 305 typically comprises tantalum atoms 310 with one or more reactive species 315. In one embodiment, the tantalum containing compound may be a tantalum based organo-metallic precursor or a derivative thereof. Preferably, the organo-metallic precursor is pentadimethylamino-tantalum (PDMAT; Ta(NMe$_2$)$_5$). PDMAT may be used to advantage for a number of reasons. PDMAT is relatively stable. PDMAT has an adequate vapor pressure which makes it easy to deliver. In particular, PDMAT may be produced with a low halide content. The halide content of PDMAT may be produced with a halide content of less than 100 ppm, and may even be produced with a halide content of less than 30 ppm or even less than 5 ppm. Not wishing to be bound by theory, it is believed that an organo-metallic precursor with a low halide content is beneficial because halides (such as chlorine) incorporated in the barrier layer may attack the copper layer deposited thereover.

The tantalum containing compounds may be other organo-metallic precursors or derivatives thereof such as, but not limited to pentaethylmethylamino-tantalum (PEMAT; Ta(N(Et)Me)$_5$ pentadiethylamino-tantalum (PDEAT; Ta(NEt$_2$)$_5$), and any and all of derivatives of PEMAT, PDEAT, or PDMAT. Other tantalum containing compounds include without limitation TBTDET (Ta(NEt$_2$)$_3$NC$_4$H$_9$ or C$_{16}$H$_{39}$N$_4$Ta) and tantalum halides, for example TaX$_5$ where X is fluorine (F), bromine (Br) or chlorine (Cl), and derivatives thereof.

The tantalum containing compound may be provided as a gas or may be provided with the aid of a carrier gas. Examples of carrier gases which may be used include, but are not limited to, helium (He), argon (Ar), nitrogen (N$_2$), and hydrogen (H$_2$).

After the monolayer of the tantalum containing compound is chemisorbed onto the substrate 300, excess tantalum containing compound is removed from the process chamber by introducing a pulse of a purge gas thereto. Examples of purge gases which may be used include, but are not limited to, helium (He), argon (Ar), nitrogen (N$_2$), hydrogen (H$_2$), and other gases.

Referring to FIG. 3B, after the process chamber has been purged, a pulse of a nitrogen containing compound 325 is introduced into the process chamber. The nitrogen containing compound 325 may be provided alone or may be provided with the aid of a carrier gas. The nitrogen containing compound 325 may comprise nitrogen atoms 330 with one or more reactive species 335. The nitrogen containing compound preferably comprises ammonia gas (NH$_3$). Other nitrogen containing compounds may be used which include, but are not limited to, N$_x$H$_y$ with x and y being integers (e.g., hydrazine (N$_2$H$_4$)), dimethyl hydrazine ((CH$_3$)$_2$N$_2$H$_2$), t-butylhydrazine (C$_4$H$_9$N$_2$H$_3$) phenylhydrazine (C$_6$H$_5$N$_2$H$_3$), other hydrazine derivatives, a nitrogen plasma source (e.g., N$_2$, N$_2$/H$_2$, NH$_3$, or a N$_2$H$_4$ plasma), 2,2'-azoisobutane ((CH$_3$)$_6$C$_2$N$_2$), ethylazide (C$_2$H$_5$N$_3$), and other suitable gases. A carrier gas may be used to deliver the nitrogen containing compound if necessary.

A monolayer of the nitrogen containing compound 325 may be chemisorbed on the monolayer of the tantalum containing compound 305. The composition and structure of precursors on a surface during atomic-layer deposition (ALD) is not precisely known. Not wishing to be bound by theory, it is believed that the chemisorbed monolayer of the nitrogen containing compound 325 reacts with the monolayer of the tantalum containing compound 305 to form a tantalum nitride layer 309. The reactive species 315, 335 form by-products 340 that are transported from the substrate surface by the vacuum system. It is believed that the reaction of the nitrogen containing compound 325 with the tantalum containing compound 305 is self-limited since only one monolayer of the tantalum containing compound 305 was chemisorbed onto the substrate surface. In another theory, the precursors may be in an intermediate state when on a surface of the substrate. In addition, the deposited tantalum nitride layer may also contain more than simply elements of tantalum (Ta) or nitrogen (N); rather, the tantalum nitride layer may also contain more complex molecules having carbon (C), hydrogen (H), and/or oxygen (O).

After the monolayer of the nitrogen containing compound 325 is chemisorbed on the monolayer of the tantalum containing compound, any excess nitrogen containing compound is removed from the process chamber by introducing another pulse of the purge gas therein. Thereafter, as shown in FIG. 3C, the tantalum nitride layer deposition sequence of alternating chemisorption of monolayers of the tantalum containing compound and of the nitrogen containing compound may be repeated, if necessary, until a desired tantalum nitride thickness is achieved.

In FIGS. 3A–3C, the tantalum nitride layer formation is depicted as starting with the chemisorption of a monolayer of a tantalum containing compound on the substrate followed by a monolayer of a nitrogen containing compound. Alternatively, the tantalum nitride layer formation may start with the chemisorption of a monolayer of a nitrogen containing compound on the substrate followed by a monolayer of the tantalum containing compound. Furthermore, in an alternative embodiment, a pump evacuation alone between pulses of reactant gases may be used to prevent mixing of the reactant gases.

The time duration for each pulse of the tantalum containing compound, the nitrogen containing compound, and the purge gas is variable and depends on the volume capacity of a deposition chamber employed as well as a vacuum system coupled thereto. For example, (1) a lower chamber pressure of a gas will require a longer pulse time; (2) a lower gas flow rate will require a longer time for chamber pressure to rise and stabilize requiring a longer pulse time; and (3) a large-volume chamber will take longer to fill, longer for chamber pressure to stabilize thus requiring a longer pulse time. Similarly, time between each pulse is also variable and depends on volume capacity of the process chamber as well as the vacuum system coupled thereto. In general, the time duration of a pulse of the tantalum containing compound or the nitrogen containing compound should be long enough for chemisorption of a monolayer of the compound. In general, the pulse time of the purge gas should be long enough to remove the reaction by-products and/or any residual materials remaining in the process chamber.

Generally, a pulse time of about 1.0 second or less for a tantalum containing compound and a pulse time of about 1.0 second or less for a nitrogen containing compound are typically sufficient to chemisorb alternating monolayers on a substrate. A pulse time of about 1.0 second or less for a purge gas is typically sufficient to remove reaction by-products as well as any residual materials remaining in the process chamber. Of course, a longer pulse time may be used to ensure chemisorption of the tantalum containing compound and the nitrogen containing compound and to ensure removal of the reaction by-products.

During atomic layer deposition, the substrate may be maintained approximately below a thermal decomposition temperature of a selected tantalum containing compound. An exemplary heater temperature range to be used with tantalum containing compounds identified herein is approximately between about 20° C. and about 500° C. at a chamber pressure less than about 100 torr, preferably less than 50 torr. When the tantalum containing gas is PDMAT, the heater temperature is preferably between about 100° C. and about 300° C., more preferably between about 175° C. and 250° C. In other embodiments, it should be understood that other temperatures may be used. For example, a temperature above a thermal decomposition temperature may be used. However, the temperature should be selected so that more than 50 percent of the deposition activity is by chemisorption processes. In another example, a temperature above a thermal decomposition temperature may be used in which the amount of decomposition during each precursor deposition is limited so that the growth mode will be similar to an atomic layer deposition growth mode.

One exemplary process of depositing a tantalum nitride layer by atomic layer deposition in a process chamber, such as the process chamber of FIG. 1, comprises sequentially providing pentadimethylamino-tantalum (PDMAT) at a flow rate between about 100 sccm and about 1000 sccm, and preferably between about 200 sccm and 500 sccm, for a time period of about 1.0 second or less, providing ammonia at a flow rate between about 100 sccm and about 1000 sccm, preferably between about 200 sccm and 500 sccm, for a time period of about 1.0 second or less, and a purge gas at a flow rate between about 100 sccm and about 1000 sccm, preferably between about 200 sccm and 500 sccm for a time period of about 1.0 second or less. The heater temperature preferably is maintained between about 100° C. and about 300° C. at a chamber pressure between about 1.0 and about 5.0 torr. This process provides a tantalum nitride layer in a thickness between about 0.5 Å and about 1.0 Å per cycle. The alternating sequence may be repeated until a desired thickness is achieved.

In one embodiment, the barrier layer, such as a tantalum nitride barrier layer, is deposited to a sidewall coverage of about 50 Å or less. In another embodiment, the barrier layer is deposited to a sidewall coverage of about 20 Å or less. In still another embodiment, the barrier layer is deposited to a sidewall coverage of about 10 Å or less. A barrier layer with a thickness of about 10 Å or less is believed to be a sufficient barrier layer to prevent copper diffusion. In one aspect, a thin barrier layer may be used to advantage in filling sub-micron and smaller features having high aspect ratios. Of course, a barrier layer having a sidewall coverage of greater than 50 Å may be used.

The barrier layer may be further plasma annealed. In one embodiment, the barrier lay may be plasma annealed with an argon plasma or an argon/hydrogen plasma. The RF power supplied to an RF electrode may be between about 100 W and about 2000 W, preferably between about 500 W and about 1000 W for a 200 mm diameter substrate and preferably between about 1000 W and about 2000 W for a 300 mm diameter substrate. The pressure of the chamber may be less than 100 torr, preferably between 0.1 torr and about 5 torr, and more preferably between about 1 torr and 3 torr. The heater temperature may be between about 20° C. and about 500° C. The plasma anneal may be performed after a cycle, a plurality of cycles, or after formation of the barrier layer.

Embodiments of atomic layer deposition of the barrier layer have been described above as chemisorption of a monolayer of reactants on a substrate. The present invention also includes embodiments in which the reactants are deposited to more or less than a monolayer. The present invention also includes embodiments in which the reactants are not deposited in a self-limiting manner. The present invention also includes embodiments in which the barrier layer 204 is deposited in mainly a chemical vapor deposition process in which the reactants are delivered sequentially or simultaneously. The present invention also include embodiments in which the barrier layer 204 is deposited in a physical vapor deposition process in which the target comprises the material to be deposited (i.e. a tantalum target in a nitrogen atmosphere for the deposition of tantalum nitride).

Process Chamber Adapted for Depositing a Seed Layer

In one embodiment, the seed layer may be deposited by any suitable technique such as physical vapor deposition, chemical vapor deposition, electroless deposition, or a combination of techniques. Suitable physical vapor deposition techniques for the deposition of the seed layer include techniques such as high density plasma physical vapor deposition (HDP PVD) or collimated or long throw sputtering. One type of HDP PVD is self-ionized plasma physical vapor deposition. An example of a chamber capable of self-ionized plasma physical vapor deposition of a seed layer is a SIP™ chamber, available from Applied Materials, Inc. of Santa Clara, Calif. Exemplary embodiments of chambers capable of self-ionized physical vapor deposition are described in U.S. Pat. No. 6,183,614, entitled "Rotating Sputter Magnetron Assembly," which is herein incorporated by reference to the extent not inconsistent with the present invention.

Figure 4:
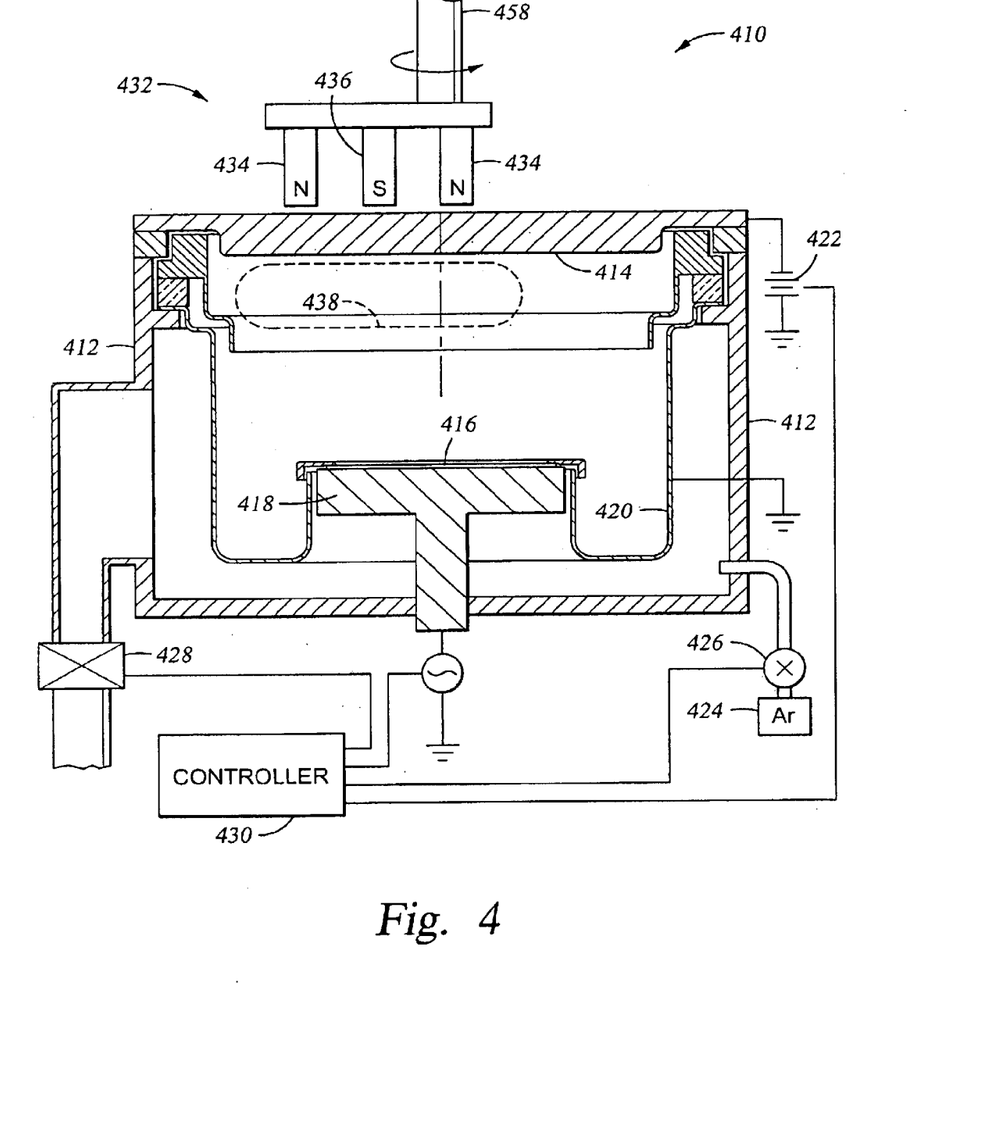
FIG. 4 is a schematic cross-sectional view of one embodiment of a process system capable of physical vapor deposition which may be used to deposit a copper alloy seed layer.

FIG. 4 is a schematic cross-sectional view of one embodiment of a process system 410 capable of physical vapor deposition which may be used to deposit a seed layer. Of course, other processing systems and other types of physical vapor deposition may also be used.

The process system 410 includes a vacuum chamber 412 sealed to a PVD target 414 composed of the material to be sputter deposited on a wafer 416 held on a heater pedestal 418. A shield 420 held within the chamber protects the walls of the chamber 412 from the sputtered material and provides the anode grounding plane. A selectable DC power supply 422 negatively biases the target 414 with respect to the shield 420.

A gas source 424 supplies a sputtering working gas, typically the chemically inactive gas argon, to the chamber 412 through a mass flow controller 426. A vacuum system 428 maintains the chamber at a low pressure. A computer-based controller 430 controls the reactor including the DC power supply 422 and the mass flow controllers 426.

When the argon is admitted into the chamber, the DC voltage between the target 414 and the shield 420 ignites the argon into a plasma, and the positively charged argon ions are attracted to the negatively charged target 414. The ions strike the target 414 at a substantial energy and cause target atoms or atomic clusters to be sputtered from the target 414. Some of the target particles strike the wafer 416 and are thereby deposited on it, thereby forming a film of the target material.

To provide efficient sputtering, a magnetron 432 is positioned in back of the target 414. It has opposed magnets 434, 436 creating a magnetic field within the chamber in the neighborhood of the magnets 434, 436. The magnetic field traps electrons and, for charge neutrality, the ion density also increases to form a high-density plasma region 438 within the chamber adjacent to the magnetron 432. The magnetron 432 usually rotates about a rotational axis 458 at the center of the target 414 to achieve full coverage in sputtering of the target 414.

The pedestal 418 develops a DC self-bias, which attracts ionized sputtered particles from the plasma across the plasma sheath adjacent to the wafer 416. The effect can be accentuated with additional DC or RF biasing of the pedestal electrode 418 to additionally accelerate the ionized particles extracted across the plasma sheath towards the wafer 416, thereby controlling the directionality of sputter deposition.

Seed Layer Formation

Figure 5A:
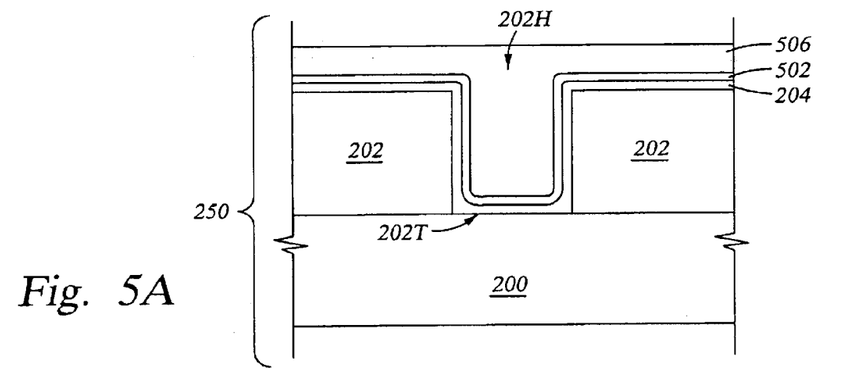
FIGS. 5A–C are schematic cross-sectional views of embodiments of depositing a seed layer over a barrier layer of FIG. 2B.
Figure 5B:
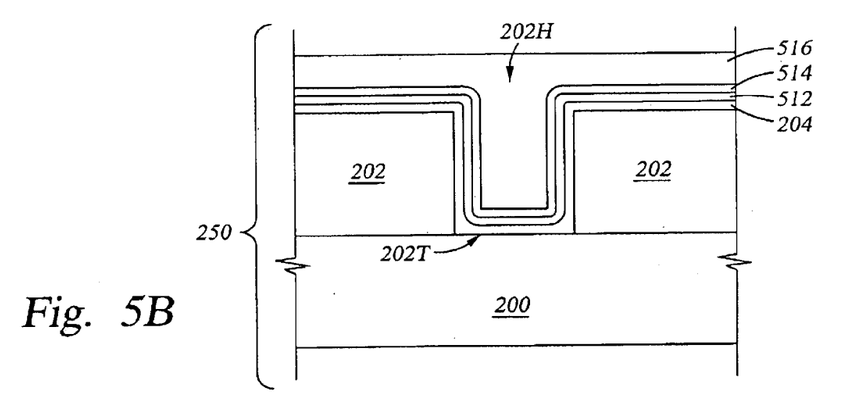
Figure 5C:
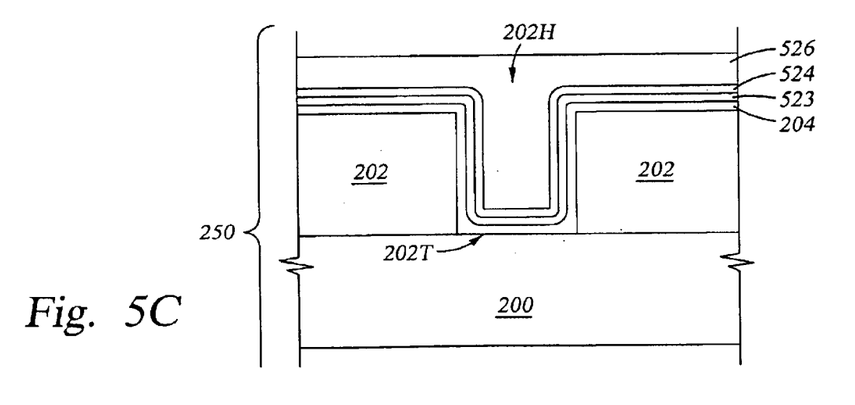

The exemplary chamber as described in FIG. 4 may be used to implement the following process. Of course, other process chambers may be used. FIGS. 5A–5C are schematic cross-sectional view of exemplary embodiments of depositing a seed layer over a barrier layer.

One embodiment, as shown in FIG. 5A, comprises depositing a copper alloy seed layer 502 over a barrier layer 204 of FIG. 2B and depositing a copper conductive material layer 506 over the copper alloy seed layer 502 to fill the feature. The term "copper conductive material layer" as used in the specification is defined as a layer comprising copper or a copper alloy. The copper alloy seed layer 502 comprises a copper metal alloy that aids in subsequent deposition of materials thereover. The copper alloy seed layer 502 may comprise copper and a second metal, such as aluminum, magnesium, titanium, zirconium, tin, other metals, and combinations thereof. The second metal preferably comprises aluminum, magnesium, titanium, and combinations thereof and more preferably comprises aluminum. In certain embodiments, the copper alloy seed layer comprises a second metal in a concentration having the lower limits of about 0.001 atomic percent, about 0.01 atomic percent, or about 0.1 atomic percent and having the upper limits of about 5.0 atomic percent, about 2.0 atomic percent, or about 1.0 atomic percent. The concentration of the second metal in a range from any lower limit to any upper limit is within the scope of the present invention. The concentration of the second metal in the copper alloy seed layer 502 is preferably less than about 5.0 atomic percent to lower the resistance of the copper alloy seed layer 502. The term "layer" as used in the specification is defined as one or more layers. For example, for a copper alloy seed layer 502 comprising copper and a second metal in a concentration in a range between about 0.001 atomic percent and about 5.0 atomic percent, the copper alloy seed layer 502 may comprise a plurality of layers in which the total composition of the layers comprises copper and the second metal in a concentration between about 0.001 atomic percent and about 5.0 atomic percent. For illustration, examples of a copper alloy seed layer 502 comprising a plurality of layers in which the total composition of the layers comprises copper and the second metal in a concentration between about 0.001 atomic percent and about 5.0 atomic percent may comprises a first seed layer comprising the second metal and a second seed layer comprising copper, may comprise a first seed layer comprising a copper/second metal alloy and a second seed layer comprising a copper/second metal alloy, or may comprise a first seed layer comprising a copper/second metal alloy and a second seed layer comprising copper, etc.

The copper alloy seed layer 502 is deposited to a thickness of at least about a 5 Å coverage of the sidewalls of the feature or to a thickness of at least a continuous coverage of the sidewalls of the feature. In one embodiment, the copper alloy seed layer 502 is deposited to a thickness at the field areas between about 10 Å and about 2000 Å, preferably between about 500 Å and about 1000 Å for a copper alloy seed layer 502 deposited by physical vapor deposition.

Another embodiment, as shown in FIG. 5B, comprises depositing a copper alloy seed layer 512 over a barrier layer 204 of FIG. 2B, depositing a second seed layer 514 over the copper alloy seed layer 512, and depositing a copper conductive material layer 516 over the second seed layer 514 to fill the feature. The copper alloy seed layer 512 comprises a copper metal alloy that aids in subsequent deposition of materials thereover. The copper alloy seed layer 512 may comprise copper and a second metal, such as aluminum, magnesium, titanium, zirconium, tin, other metals, and combinations thereof. The second metal preferably comprises aluminum, magnesium, titanium, and combinations thereof and more preferably comprises aluminum. In certain embodiments, the copper alloy seed layer comprises a second metal in a concentration having the lower limits of about 0.001 atomic percent, about 0.01 atomic percent, or about 0.1 atomic percent and having the upper limits of about 5.0 atomic percent, about 2.0 atomic percent, or about 1.0 atomic percent. The concentration of the second metal in a range from any lower limit to any upper limit is within the scope of the present invention. In one embodiment, the second seed layer 514 comprises undoped copper (i.e. pure copper). In one aspect, a second seed layer 514 comprising undoped copper is used because of its lower electrical resistivity than a copper alloy seed layer 512 of the same thickness and because of its higher resistance to surface oxidation.

The copper alloy seed layer 512 may be deposited to a thickness of less than a monolayer (i.e. a sub-monolayer thickness or a discontinuous layer) over the sidewalls of the feature. In one embodiment, the combined thickness of the copper alloy seed layer 512 and the second seed layer 514 at the field areas is between about 10 Å and about 2000 Å, preferably between about 500 Å and about 1000 Å for a copper alloy seed layer 512 and second seed layer 514 deposited by physical vapor deposition.

Another embodiment, as shown in FIG. 5C, comprises depositing a first seed layer 523 over a barrier layer 204 of FIG. 2B, depositing a second seed layer 524 over the first seed layer 523, and depositing a copper conductive material layer 526 over the second seed layer 524 to fill the feature. The first seed layer 523 comprises a metal selected from the group consisting of aluminum, magnesium, titanium, zirconium, tin, and combinations thereof. Preferably, the first seed layer 523 comprises aluminum. In one embodiment, the second seed layer 514 comprises undoped copper (i.e. pure copper).

The first seed layer 523 may be deposited to a thickness of less than a monolayer (i.e. a sub-monolayer thickness or a discontinuous layer) over the sidewalls of the feature. In one embodiment, the first seed layer is deposited to a thickness of less than about 50 Å sidewall coverage, preferably less than about 40 Å sidewall coverage, to lower the total resistance of the combined seed layer. The combined thickness of the first seed layer 523 and the second seed layer 524 at the field areas is between about 10 Å and about 2000 Å, preferably between about 500 Å and about 1000 Å for a first seed layer 523 and second seed layer 524 deposited by physical vapor deposition.

The copper alloy seed layer 502, 512, the first seed layer 523, or the second seed layer 514, 524 may be deposited by such techniques including physical vapor deposition, chemical vapor deposition, atomic layer deposition, electroless deposition, or a combination of techniques. In general, if a seed layer is deposited utilizing physical vapor deposition techniques, a chamber, such as the chamber 412 as described in FIG. 4, includes a target, such as target 414, having a composition similar to the metal or metal alloy intended to be deposited. For example, to deposit a copper alloy seed layer 502, 512 the target may comprise copper and a second metal, such as aluminum, magnesium, titanium, zirconium, tin, other metals, and combinations thereof. The second metal preferably comprises aluminum. In certain embodiments, the target comprises a second metal in a concentration having the lower limits of about 0.001 atomic percent, about 0.01 atomic percent, or about 0.1 atomic percent and having the upper limits of about 5.0 atomic percent, about 2.0 atomic percent, or about 1.0 atomic percent. The concentration of the second metal in a range from any lower limit to any upper limit is within the scope of the present invention. In another example, to deposit a first seed layer 523, the target comprises a metal selected from the group consisting of aluminum, magnesium, titanium, zirconium, tin, and combinations thereof. If a seed layer is deposited by chemical vapor deposition or atomic layer deposition, a chamber, such as the chamber as described in FIG. 1, is adapted to deliver suitable metal precursors of the metal or metal alloy to be deposited.

One exemplary process of depositing a seed layer by physical vapor deposition in a process chamber, such as the process chamber of FIG. 4, comprises utilizing a target of the material to be deposited. The process chamber may be maintained at a pressure of between about 0.1 mtorr and about 10 mtorr. The target may be DC-biased at a power between about 5 kW and about 100 kW. The pedestal may be RF-biased at a power between about 0 and about 1000 W. The pedestal may be unheated (i.e. room temperature).

The copper conductive material layer 506, 516, 526 may be deposited by electroplating, physical vapor deposition, chemical vapor deposition, electroless deposition or a combination of techniques. Preferably, the copper conductive material layer 506, 516, 526 is deposited by electroplating because of the bottom-up growth which may be obtained in electroplating processes. An exemplary electroplating method is described in U.S. Pat. No. 6,113,771, entitled "Electro Deposition Chemistry", issued Sep. 5, 2000, and is incorporated herein by reference to the extent not inconsistent with this invention.

It has been observed that a copper alloy seed layer, such as a copper-aluminum seed layer, has improved adhesion over a barrier layer when compared to an undoped copper seed layer over the barrier layer. Because the copper alloy seed layer has good adhesion over a barrier layer, the copper alloy seed layer acts as a good wetting agent to materials deposited thereon. Not wishing to bound by theory, it is believed that the concentration of the copper and other metals of the copper seed layer provides a seed layer with good wetting properties and good electrical characteristics. It is further believed that a copper alloy seed layer having a total thickness of less than a monolayer may be used as long as a second seed layer, such as an undoped seed layer, is deposited thereover to provide at least a combined continuous seed layer since the copper alloy seed layer provides an improved interface for adhesion of materials thereon.

Similarly, it has been observed that a metal seed layer, such as an aluminum seed layer, has improved adhesion over a barrier layer when compared to an undoped copper seed layer over the barrier layer. Because the metal seed layer has good adhesion over a barrier layer, the metal seed layer acts as a good wetting agent to materials deposited thereon. Not wishing to bound by theory, it is believed that a metal seed layer, such as an aluminum seed layer, having a total thickness of less than a monolayer may be used since the metal layer provides an improved interface for adhesion of materials thereon, such as an undoped copper seed layer deposited over the metal layer.

The seed layers as disclosed herein have improved adhesion over barrier layers and have good wetting properties for materials deposited thereover, such as a copper conductive material layer deposited thereover. Therefore, the seed layers increase device reliability by reducing the likelihood of agglomeration, dewetting, or the formation of voids in the copper conductive material layer during deposition of the copper conductive material layer, during subsequent processing at high temperatures, and during thermal stressing of the devices during use of the devices.

In one aspect, the seed layers may be used with any barrier layer and may be used with barrier layers deposited by any deposition technique. The seed layers also may be deposited by any deposition technique. Furthermore, a conductive material layer, such as a copper conductive material layer, may be deposited over the seed layers by any deposition technique.

The present process may be used to advantage in filling apertures having less than about 0.2 micron opening width and having an aspect ratio of greater than about 4:1, about 6:1; or about 10:1.

Figure 6:
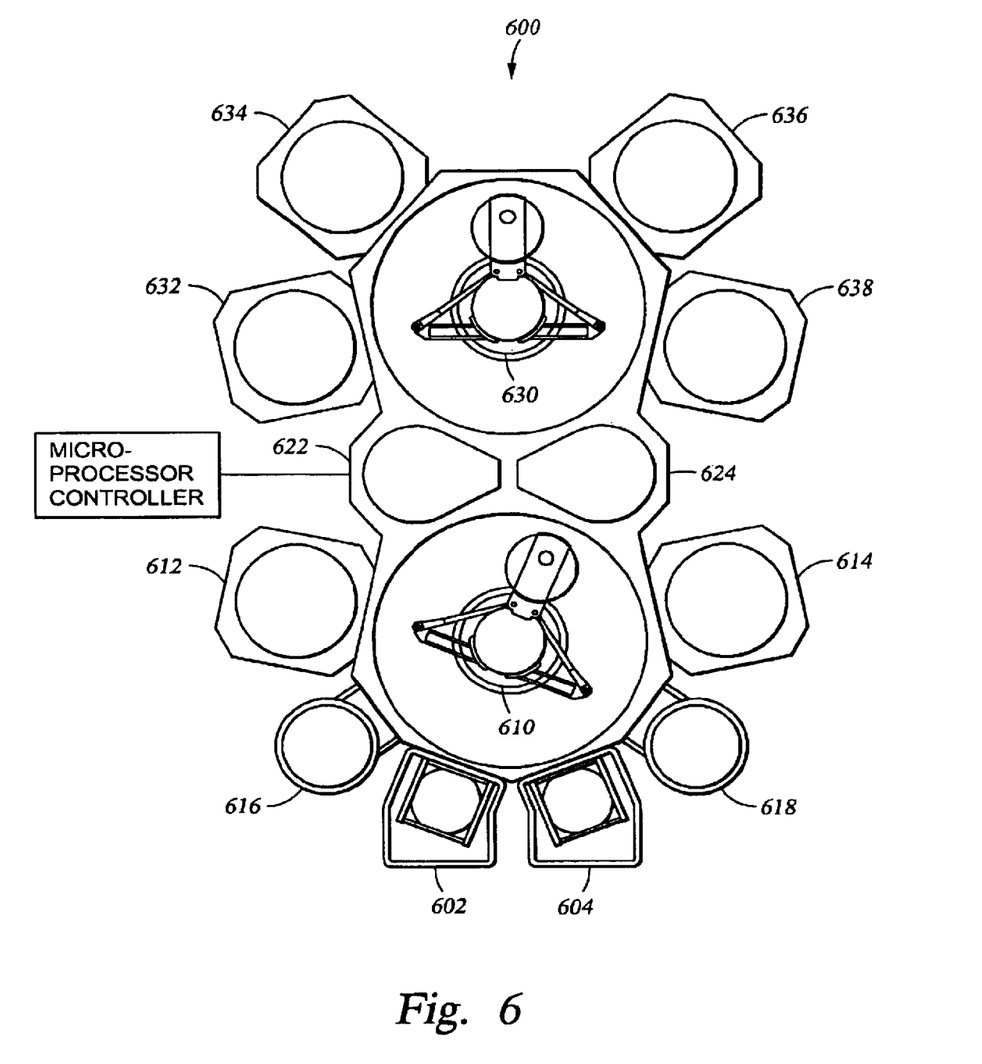
FIG. 6 is a schematic top-view diagram of one example of a multi-chamber processing system as disclosed within embodiment herein.

The processes as disclosed herein may be carried out in separate chambers or may be carried out in a multi-chamber processing system having a plurality of chambers. FIG. 6 is a schematic top-view diagram of one example of a multi-chamber processing system 600 which may be adapted to perform processes as disclosed herein. The apparatus is an ENDURA™ system and is commercially available from Applied Materials, Inc., of Santa Clara, Calif. A similar multi-chamber processing system is disclosed in U.S. Pat. No. 5,186,718, entitled "Stage Vacuum Wafer Processing System and Method," (Tepman et al.), issued on Feb. 16, 1993, where is hereby incorporated by reference to the extent not inconsistent with the present disclosure. The particular embodiment of the system 600 is provided to illustrate the invention and should not be used to limit the scope of the invention.

The system 600 generally includes load lock chambers 602, 604 for the transfer of substrates into and out from the system 600. Typically, since the system 600 is under vacuum, the load lock chambers 602, 604 may "pump down" the substrates introduced into the system 600. A first robot 610 may transfer the substrates between the load lock chambers 602, 604, processing chambers 612, 614, transfer chambers 622, 624, and other chambers 616, 618. A second robot 630 may transfer the substrates between processing chambers 632, 634, 636, 638 and the transfer chambers 622, 624. Processing chambers 612, 614, 632, 634, 636, 638 may be removed from the system 600 if not necessary for the particular process to be performed by the system 600.

In one embodiment, the system 600 is configured so that processing chamber 634 is adapted to deposit a copper alloy seed layer 502. For example, the processing chamber 634 for depositing a copper alloy seed layer 502 may be a physical vapor deposition chamber, a chemical vapor deposition chamber, or an atomic layer deposition chamber. The system 600 may be further configured so that processing chamber 632 is adapted to deposit a barrier layer 204 in which the copper alloy seed layer 502 is deposited over the barrier layer. For example, the processing chamber 632 for depositing the barrier layer 204 may be an atomic layer deposition chamber, a chemical vapor deposition chamber, or a physical vapor deposition chamber. In one specific embodiment, the processing chamber 632 may be an atomic layer deposition chamber, such as the chamber shown in FIG. 1, and the processing chamber 634 may be a physical vapor deposition chamber, such as the chamber shown in FIG. 4.

In another embodiment, the system 600 is configured so that processing chamber 634 is adapted to deposit a copper alloy seed layer 512 and so that processing chamber 636 is adapted to deposit a second seed layer 514 over the copper alloy seed layer 512. For example, the processing chamber 634 for depositing a copper alloy seed layer 512 and/or the processing chamber 636 for depositing a second seed layer may be a physical vapor deposition chamber, a chemical vapor deposition chamber, or an atomic layer deposition chamber. The system 600 may be further configured so that processing chamber 632 is adapted to deposit a barrier layer 204 in which the copper alloy seed layer 512 is deposited over the barrier layer. For example, the processing chamber 632 for depositing the barrier layer 204 may be an atomic layer deposition chamber, a chemical vapor deposition chamber, or a physical vapor deposition chamber. In one specific embodiment, processing chamber 632 may be an atomic layer deposition chamber, such as the chamber shown in FIG. 1, and processing chambers 634, 636 may be physical vapor deposition chambers, such as the chamber shown in FIG. 4.

In another embodiment, the system 600 is configured so that processing chamber 634 is adapted to deposit a metal seed layer 523 and so that processing chamber 636 is adapted to deposit a second seed layer 524 over the metal seed layer 523. For example, the processing chamber 634 for depositing a metal seed layer 523 and/or the processing chamber 636 for depositing a second seed layer 524 may be a physical vapor deposition chamber, a chemical vapor deposition chamber, or an atomic layer deposition chamber. The system may be further configured so that processing chamber 632 is adapted to deposit a barrier layer 204 in which the metal seed layer 523 is deposited over the barrier layer. For example, the processing chamber 632 for depositing the barrier layer 204 may be an atomic layer deposition chamber, a chemical vapor deposition chamber, or a physical vapor deposition chamber. In one specific embodiment, processing chamber 632 may be an atomic layer deposition chamber, such as the chamber shown in FIG. 1, and processing chambers 634, 636 may be physical vapor deposition chambers, such as the chamber shown in FIG. 4.

In one aspect, deposition of a barrier layer 204 and a seed layer (such as a copper alloy seed layer 502, a copper alloy seed layer 512 and a second seed layer 514, or a metal seed layer 523 and a second seed layer 524) may be performed in a multi-chamber processing system under vacuum to prevent air and other impurities from being incorporated into the layers and to maintain the seed structure over the barrier layer 204.

Other embodiments of the system 600 are within the scope of the present invention. For example, the position of a particular processing chamber on the system may be altered. In another example, a single processing chamber may be adapted to deposit two different layers.

EXAMPLES

Example 1

A TaN layer was deposited over a substrate by atomic layer deposition to a thickness of about 20 Å. A seed layer was deposited over the TaN layer by physical vapor deposition to a thickness of about 100 Å. The seed layer comprised either 1) undoped copper deposited utilizing a target comprising undoped copper, 2) a copper alloy comprising aluminum in a concentration of about 2.0 atomic percent deposited utilizing a copper-aluminum target comprising aluminum in a concentration of about 2.0 atomic percent, 3) a copper alloy comprising tin in a concentration of about 2.0 atomic percent deposited utilizing a copper-tin target comprising tin in a concentration of about 2.0 atomic percent, or 4) a copper alloy comprising zirconium in a concentration of about 2.0 atomic percent deposited utilizing a copper-zirconium target comprising zirconium in a concentration of about 2.0 atomic percent. The resulting substrate was annealed at a temperature of about 380° C. for a time period of about 15 minutes in a nitrogen ($N_2$) and hydrogen ($H_2$) ambient.

Scanning electron microscope photographs showed agglomeration of the undoped copper layer after the anneal. The copper-zirconium alloy showed less agglomeration than the undoped copper layer. The copper-tin alloy showed less agglomeration than the copper-zirconium alloy. The copper-aluminum alloy showed no significant agglomeration.

Example 2

Copper-aluminum alloy films comprising about 2.0 atomic percent of aluminum were deposited on different substrates by physical vapor deposition utilizing a copper-aluminum target comprising aluminum in a concentration of 2.0 atomic percent. The resulting substrates included 1) a copper-aluminum layer deposited to a thickness of about 50 Å over an ALD TaN layer, 2) a copper-aluminum layer deposited to a thickness of about 50 Å over about a 100 Å Ta layer, 3) a copper-aluminum layer deposited to a thickness of about 100 Å over an ALD TaN layer, 4) a copper-aluminum layer deposited to a thickness of about 100 Å over a silicon nitride (SiN) layer, and 5) a copper-aluminum layer deposited to a thickness of about 100 Å over a silicon oxide layer. The resulting substrates were annealed at a temperature of about 380° C. for a time period of about 15 minutes in a nitrogen ($N_2$) and hydrogen ($H_2$) ambient. Scanning electron microscope photographs showed that there was no significant agglomeration of the copper-aluminum alloy over the various substrates.

Example 3

Copper-aluminum alloy films comprising about 2.0 atomic percent of aluminum were deposited by physical vapor deposition utilizing a copper-aluminum target comprising aluminum in a concentration of 2.0 atomic percent to either a 50 Å or 100 Å thickness over an ALD TaN layer. The resulting substrates were annealed at a temperature of about 380° C., about 450° C., or about 500° C. for a time period of about 15 minutes in a nitrogen ($N_2$) and hydrogen ($H_2$) ambient. Scanning electron microscope photographs showed that there was no significant agglomeration of the copper-aluminum alloy for substrates annealed at temperatures of about 380° C. or about 450° C. The copper-aluminum alloy showed some dewetting began to occur for substrates annealed at a temperature of about 500° C.

Example 4

Copper-aluminum alloy films comprising about 2.0 atomic percent of aluminum were deposited by physical vapor deposition utilizing a copper-aluminum target comprising aluminum in a concentration of about 2.0 atomic percent to either about a 50 Å or about a 100 Å thickness over an ALD TaN layer. The resulting substrates were annealed at a temperature of about 450° C. for a time period of about 30 minutes in a nitrogen ($N_2$) and hydrogen ($H_2$) ambient. Scanning electron microscope photographs showed that there was no significant agglomeration of the copper-aluminum alloy for substrates annealed at a temperature of about 450° C. for a time period of about 30 minutes.

While foregoing is directed to the preferred embodiment of the present invention, other and further embodiments of the invention may be devised without departing from the basic scope thereof, and the scope thereof is determined by the claims that follow.

What is claimed is:

1. A system for processing a substrate, comprising:
    at least one atomic layer deposition barrier chamber for depositing a barrier layer comprising tantalum nitride, wherein the at least one atomic layer deposition barrier chamber comprises a first source providing PDMAT and a second source providing ammonia; and
    at least one physical vapor deposition metal seed chamber for depositing a copper alloy seed layer over the barrier layer, wherein the copper alloy seed layer comprises copper and a metal selected from the group consisting of aluminum, magnesium, titanium, zirconium, tin, and combinations thereof and wherein the metal is present in the copper alloy in a concentration between about 0.01 atomic percent and about 2.0 atomic percent.

2. The system of claim 1, wherein the physical vapor deposition metal seed chamber is a high density plasma physical vapor deposition metal seed chamber.

3. The system of claim 1, further comprising one or more transfer chambers for transferring a substrate between the atomic layer deposition barrier chamber and the physical vapor deposition metal seed chamber.

4. A system for processing a substrate, comprising:
    at least one atomic layer deposition barrier chamber for depositing a barrier layer comprising tantalum nitride, wherein the at least one atomic layer deposition barrier chamber comprises a first source providing PDMAT and a second source providing ammonia;
    at least one physical vapor deposition copper alloy seed chamber for depositing a copper alloy seed layer over the barrier layer, wherein the copper alloy seed layer comprises copper and a metal selected from the group consisting of aluminum, magnesium, titanium, zirconium, tin, and combinations thereof; and
    at least one physical vapor deposition undoped copper seed chamber for depositing an undoped copper seed layer over the copper alloy seed layer.

5. The system of claim 4, wherein the physical vapor deposition copper alloy seed chamber is a high density plasma physical vapor deposition copper alloy seed chamber and the physical vapor deposition undoped copper seed chamber is a high density plasma physical vapor deposition undoped copper seed chamber.

6. The system of claim 4, further comprising one or more transfer chambers for transferring a substrate between the atomic layer deposition barrier chamber, the physical vapor deposition copper alloy seed chamber, and the physical vapor deposition undoped copper seed chamber.

7. A system for processing a substrate, comprising:
    at least one atomic layer deposition barrier chamber for depositing a barrier layer comprising tantalum nitride, wherein the at least one atomic layer deposition barrier chamber comprises a first source providing PDMAT and a second source providing ammonia:
    at least one physical vapor deposition metal seed chamber for depositing a metal seed layer over the barrier layer, wherein the metal seed layer comprises a metal selected from the group consisting of aluminum, magnesium, titanium, zirconium, tin, and combinations thereof; and
    at least one physical vapor deposition undoped copper seed chamber for depositing an undoped copper seed layer over the metal seed layer.

8. The system claim 7, wherein the physical vapor deposition metal seed chamber is a high density plasma physical vapor deposition metal seed chamber and the physical vapor deposition undoped copper seed chamber is a high density plasma physical vapor deposition undoped copper seed chamber.

9. The system of claim 7, further comprising one or more transfer chambers for transferring a substrate between the atomic layer deposition barrier chamber, the physical vapor deposition metal seed chamber, and the physical vapor deposition undoped copper seed chamber.

10. The system of claim 1, wherein the copper alloy seed layer is deposited directly on the barrier layer comprising tantalum nitride.

11. The system of claim 4, wherein the copper alloy seed layer is deposited directly on the barrier layer comprising tantalum nitride.

12. The system of claim 7, wherein the metal seed layer is deposited directly on the barrier layer comprising tantalum nitride.

13. The system of claim 1, wherein the copper alloy seed layer comprises the metal present in the copper alloy in a concentration between about 0.1 atomic percent and about 1.0 atomic percent.

14. The system of claim 7, wherein the atomic layer deposition barrier chamber comprises a first source providing a tantalum containing compound and a second source providing a nitrogen containing compound.

15. The system of claim 7, wherein the copper alloy seed layer comprises copper and aluminum.

16. The system of claim 1, wherein the copper alloy seed layer comprises copper and titanium.

17. The system of claim 4, wherein the copper alloy seed layer comprises the metal present in the copper alloy in a concentration between about 0.001 atomic percent and about 5.0 atomic percent.

18. The system of claim 4, wherein the copper alloy seed layer comprises the metal present in the copper alloy n a concentration between about 0.01 atomic percent and about 2.0 atomic percent.

19. The system of claim 4, wherein the atomic layer deposition barrier chamber comprises a first source providing a tantalum containing compound and a second source providing a nitrogen containing compound.

20. The system of claim 4, wherein the copper alloy seed layer comprises copper and aluminum.

21. The system of claim 4, wherein the copper alloy seed layer comprises copper and titanium.

22. A system for processing a substrate, comprising:
- at least one atomic layer deposition barrier chamber comprising a first source providing PDMAT and a second source providing a nitrogen containing compound;
- at least one physical vapor deposition metal seed chamber having a copper alloy target comprising copper and a metal selected from the group consisting of aluminum, titanium, and combinations thereof and wherein the metal is present in the copper alloy target in a concentration between about 0.001 atomic percent and about 5.0 atomic percent; and
- at least one transfer chamber for transferring the substrate between the atomic layer deposition barrier chamber and the physical vapor deposition metal seed chamber.

23. The system of claim 22, wherein the metal is present in the copper alloy target in a concentration between about 0.01 atomic percent and about 2.0 atomic percent.

24. The system of claim 23, wherein the metal is present in the copper alloy target in a concentration between about 0.1 atomic percent and about 1.0 atomic percent.

25. The system of claim 23, wherein the copper alloy target consists essentially of copper and aluminum.

26. The system of claim 23, wherein the copper alloy target consists essentially of copper and titanium.

27. The system of claim 22, wherein the nitrogen containing compound is ammonia.

28. The system of claim 1, wherein the PDMAT has a chlorine concentration of about 5 ppm or less.

29. The system of claim 4, wherein the PDMAT has a chlorine concentration of about 5 ppm or less.

30. The system of claim 7, wherein the PDMAT has a chlorine concentration of about 5 ppm or less.

31. The system of claim 22, wherein the PDMAT has a chlorine concentration of about 5 ppm or less.

* * * * *